United States Patent
Kato

(10) Patent No.: US 11,641,714 B2
(45) Date of Patent: May 2, 2023

(54) RFID TAG

(71) Applicant: Murata Manufacturing Co., Ltd., Nagaokakyo (JP)

(72) Inventor: Noboru Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 929 days.

(21) Appl. No.: 16/296,473

(22) Filed: Mar. 8, 2019

(65) Prior Publication Data

US 2019/0208636 A1 Jul. 4, 2019

Related U.S. Application Data

(63) Continuation of application No. PCT/JP2018/005754, filed on Feb. 19, 2018.

(30) Foreign Application Priority Data

Feb. 21, 2017 (JP) .............................. JP2017-030279

(51) Int. Cl.
*H05K 1/11* (2006.01)
*H01Q 1/38* (2006.01)
(Continued)

(52) U.S. Cl.
CPC ........... *H05K 1/118* (2013.01); *G06K 19/077* (2013.01); *G06K 19/0723* (2013.01);
(Continued)

(58) Field of Classification Search
CPC . H05K 1/118; H05K 1/02; H05K 1/11; H05K 1/0243; H05K 1/111; H05K 1/165;
(Continued)

(56) References Cited

U.S. PATENT DOCUMENTS

2013/0140371 A1 * 6/2013 Omura .................. H01Q 21/24
235/492
2013/0328153 A1   12/2013 Miura
(Continued)

FOREIGN PATENT DOCUMENTS

EP         1288016 A1 *  3/2003  ............... H01Q 7/08
JP       2004295771 A    10/2004
(Continued)

OTHER PUBLICATIONS

International Search Report issued for PCT/JP2018/005754, dated Mar. 13, 2018.
(Continued)

*Primary Examiner* — Thien M Le
*Assistant Examiner* — Tae W Kim
(74) *Attorney, Agent, or Firm* — ArentFox Schiff LLP

(57) ABSTRACT

An RFID tag is provided that includes an RFIC module with a base substrate and an RFIC chip, and an antenna element. A principal surface of the base substrate is provided with a first chip connection terminal connected to a first input/output terminal of the RFIC chip, a second chip connection terminal connected to a second input/output terminal, a first module-side terminal connected by direct current or capacitively coupled to a first antenna-side terminal of the antenna element, a second module-side terminal connected by direct current or capacitively coupled to a second antenna-side terminal, a first wiring pattern connecting the first chip connection terminal and the first module-side terminal, a second wiring pattern connecting the second chip connection terminal and the second module-side terminal, and a third wiring pattern connecting the first module-side terminal and the second module-side terminal.

19 Claims, 17 Drawing Sheets

(51) Int. Cl.
| | |
|---|---|
| *H05K 1/02* | (2006.01) |
| *H01Q 9/26* | (2006.01) |
| *H01L 23/32* | (2006.01) |
| *H01Q 1/50* | (2006.01) |
| *G06K 19/07* | (2006.01) |
| *G06K 19/077* | (2006.01) |
| *H05K 1/16* | (2006.01) |
| *H05K 1/18* | (2006.01) |

(52) U.S. Cl.
CPC ............... *H01L 23/32* (2013.01); *H01Q 1/38* (2013.01); *H01Q 1/50* (2013.01); *H01Q 9/26* (2013.01); *H05K 1/02* (2013.01); *H05K 1/0243* (2013.01); *H05K 1/11* (2013.01); *H05K 1/111* (2013.01); *H05K 1/165* (2013.01); *H05K 1/181* (2013.01); *H05K 2201/09263* (2013.01); *H05K 2201/10098* (2013.01); *H05K 2201/2009* (2013.01)

(58) Field of Classification Search
CPC ......... H05K 1/181; H05K 2201/09263; H05K 2201/10098; H05K 2201/2009; H01Q 1/38; H01Q 9/26; H01Q 1/50; H01L 23/32; G06K 19/0723; G06K 19/077
See application file for complete search history.

(56) References Cited

U.S. PATENT DOCUMENTS

| | | | |
|---|---|---|---|
| 2016/0350638 A1* | 12/2016 | Kato | ................ G06K 19/07752 |
| 2017/0083804 A1 | 3/2017 | Kato et al. | |
| 2018/0060717 A1 | 3/2018 | Kato et al. | |
| 2018/0114104 A1 | 4/2018 | Kato et al. | |

FOREIGN PATENT DOCUMENTS

| | | | |
|---|---|---|---|
| JP | 2006202266 A | | 8/2006 |
| JP | 2007081632 A | * | 3/2007 |
| JP | 2011095844 A | | 5/2011 |
| JP | 2015005794 A | | 1/2015 |
| JP | 2016167274 A | | 9/2016 |
| WO | 2012114857 A1 | | 8/2012 |
| WO | 2016072335 A1 | | 5/2016 |
| WO | 2016084658 A1 | | 6/2016 |
| WO | 2017018117 A1 | | 2/2017 |

OTHER PUBLICATIONS

Written Opinion of the International Searching Authority issued for PCT/JP2018/005754, dated Mar. 13, 2018.

* cited by examiner

RFID TAG

CROSS REFERENCE TO RELATED APPLICATIONS

The present application is a continuation of PCT/JP2018/005754 filed Feb. 19, 2018, which claims priority to Japanese Patent Application No. 2017-030279, filed Feb. 21, 2017, the entire contents of each of which are incorporated herein by reference.

TECHNICAL FIELD

The present invention relates to an RFID (Radio-Frequency IDentification) tag.

BACKGROUND

A conventionally known RFID tag is configured by attaching an antenna to an RFIC module including an RFIC (Radio-Frequency Integrated Circuit) chip and a matching circuit (see, e.g., Patent Document 1). By modularizing the RFIC chip and the matching circuit as the RFIC module, the production efficiency of RFID tags is improved (e.g., as compared to when an RFIC chip, a matching circuit pattern, and an antenna pattern are disposed on one board). Such an RFIC module is sometimes called a strap, for example.

Patent Document 1: WO 2016/084658.

The RFIC module described in Patent Document 1 has a multilayer structure in which a plurality of resin sheets is laminated. A helical coil included in the matching circuit is constituted by conductor patterns formed on the respective resin sheets. Therefore, the respective resin sheets must accurately be laminated. Additionally, the conductor patterns of the respective resin sheets must be connected through interlayer connection conductors such as via hole conductors penetrating the resin sheets. Thus, the RFIC module described in Patent Document 1 has a complicated structure.

SUMMARY OF THE INVENTION

Therefore, the present invention solves the problems of the complicated structure of the RFIC module of Patent Document 1, for example, by implementing a simpler structure in an RFIC module of an RFID tag.

Thus, according to an exemplary aspect, To solve the technical problem, an aspect of the present invention provides an RFID tag comprising: an RFIC module including a base substrate that includes a principal surface and an RFIC chip that includes a first input/output terminal and a second input/output terminal and that is mounted on the principal surface of the base substrate; and an antenna element including a first antenna-side terminal and a second antenna-side terminal, wherein the RFIC module includes, on the principal surface of the base substrate, a first chip connection terminal connected to the first input/output terminal of the RFIC chip, a second chip connection terminal connected to the second input/output terminal of the RFIC chip, a first module-side terminal connected in terms of a direct current, or capacitively coupled, to the first antenna-side terminal of the antenna element, a second module-side terminal connected in terms of a direct current, or capacitively coupled, to the second antenna-side terminal of the antenna element, a first wiring pattern connecting the first chip connection terminal and the first module-side terminal, a second wiring pattern connecting the second chip connection terminal and the second module-side terminal, and a third wiring pattern connecting the first module-side terminal and the second module-side terminal.

According to the present invention, a simpler structure can be implemented in the RFIC module of the RFID tag as compared with conventional designs, such as that described above with respect to Patent Document 1.

DETAILED DESCRIPTION

Figure 1:
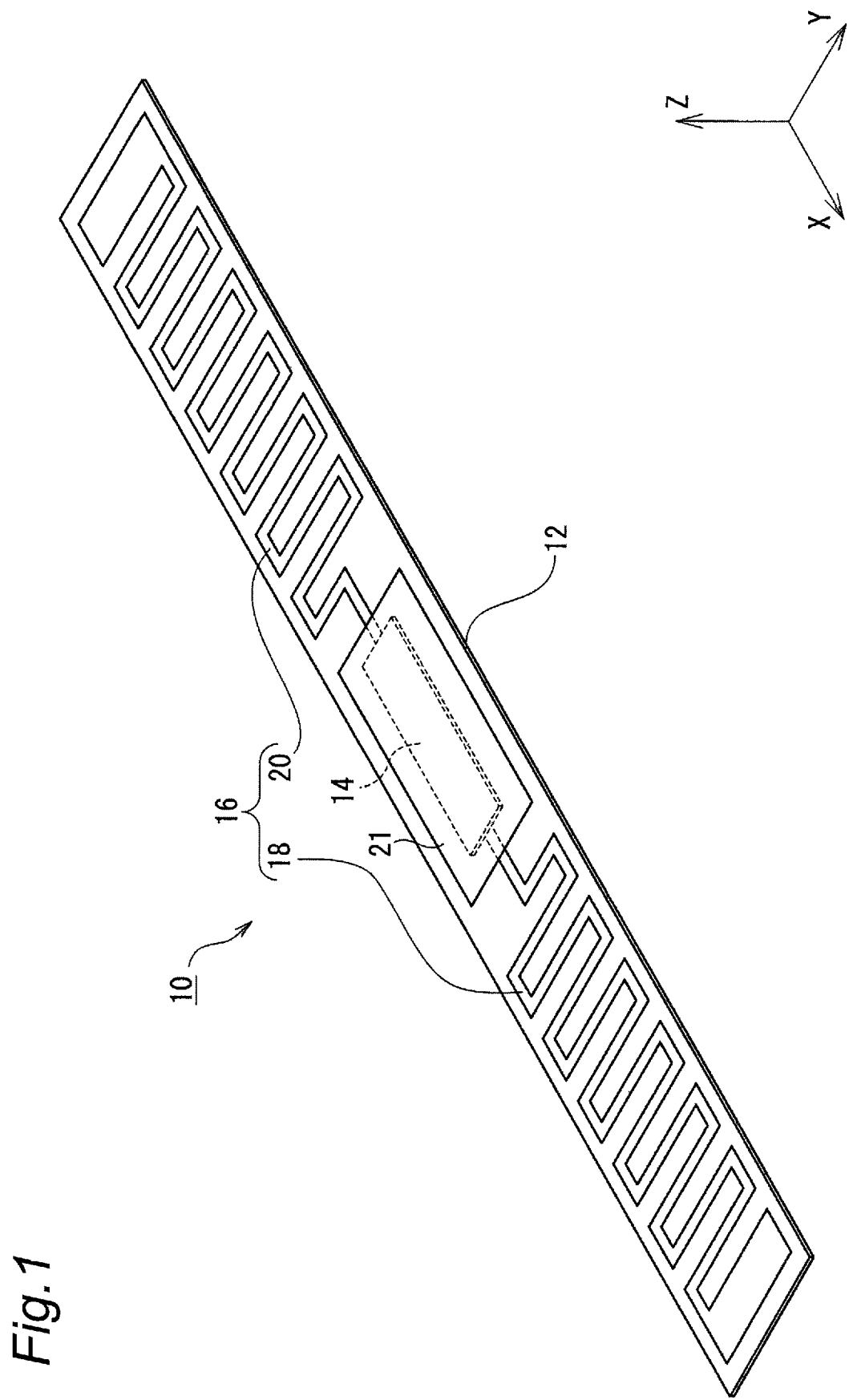
FIG. 1 is a perspective view of an RFID tag according to an exemplary embodiment.

An RFID tag of an exemplary aspect of the present disclosure includes an RFIC module with a base substrate that includes a principal surface and an RFIC chip that includes a first input/output terminal and a second input/output terminal and that is mounted on the principal surface of the base substrate. Moreover, an antenna element is provided that includes a first antenna-side terminal and a second antenna-side terminal, and the RFIC module includes, on the principal surface of the base substrate, a first chip connection terminal connected to the first input/output terminal of the RFIC chip, a second chip connection terminal connected to the second input/output terminal of the RFIC chip, a first module-side terminal connected in terms of a direct current, or capacitively coupled, to the first antenna-side terminal of the antenna element, a second module-side terminal connected in terms of a direct current, or capacitively coupled, to the second antenna-side terminal of the antenna element, a first wiring pattern connecting the first chip connection terminal and the first module-side terminal, a second wiring pattern connecting the second chip connection terminal and the second module-side terminal, and a third wiring pattern connecting the first module-side terminal and the second module-side terminal.

According to this exemplary aspect, a simple structure can be implemented in the RFIC module of the RFID tag.

In an exemplary aspect, the first module-side terminal and the second module-side terminal may face each other at an interval in a longitudinal direction of the base substrate, and the RFIC chip, the first wiring pattern, the second wiring pattern, and the third wiring pattern may be located in a region on the principal surface of the base substrate interposed between the first module-side terminal and the second module-side terminal. This configuration suppresses deformation of a portion of the base member sandwiched between the first module-side terminal and the second module-side terminal. Consequently, a damage such as disconnection is suppressed in the RFIC chip, the first wiring pattern, the second wiring pattern, and the third wiring pattern located in the portion.

Preferably, a distance between the first antenna-side terminal and the second antenna-side terminal is larger than a distance between the first module-side terminal and the second module-side terminal. As a result, variations in communication characteristics of the RFID tag are suppressed.

In an exemplary aspect, the first wiring pattern, the second wiring pattern, and the third wiring pattern each may have a meander shape. As a result, the first to third wiring patterns can be increased in inductance.

In an exemplary aspect, the meander-shaped first wiring pattern and one side portion of the meander-shaped third wiring pattern may extend in a meandering manner toward the first module-side terminal while maintaining a constant distance therebetween, and the meander-shaped second wiring pattern and the other side portion of the meander-shaped third wiring pattern may extend in a meandering manner toward the second module-side terminal while maintaining a constant distance therebetween. As a result, the capacitance can be increased between the first wiring pattern and the third wiring pattern as well as between the second wiring pattern and the third wiring pattern.

Preferably, the first chip connection terminal, the second chip connection terminal, the first module-side terminal, the second module-side terminal, the first wiring pattern, the second wiring pattern, and the third wiring pattern are integrated as one conductor pattern. As a result, an impedance can be made almost zero in a low frequency range (frequency band up to 100 MHz) therebetween, and the RFIC chip can be protected from ESD.

Moreover, the RFIC module can include a protective layer disposed on the principal surface of the base substrate to cover the RFIC chip, the first wiring pattern, the second wiring pattern, and the third wiring pattern. As a result, the first to third wiring patterns can be protected.

Preferably, the protective layer is disposed on the principal surface of the base substrate to at least partially cover the first module-side terminal and the second module-side terminal. As a result, a connecting portion between the first module-side terminal and the first wiring pattern and a connecting portion between the second module-side terminal and the second wiring pattern can be protected.

The protective layer can contain a magnetic filler according to an exemplary aspect. As a result, the first to third wiring patterns can be increased in inductance.

Moreover, the base substrate can be flexible. As a result, the RFIC module and the antenna element are entirely brought into close contact with each other so that the RFID tag can have high rigidity Exemplary embodiments of the present invention will now be described with reference to the drawings.

Figure 2:
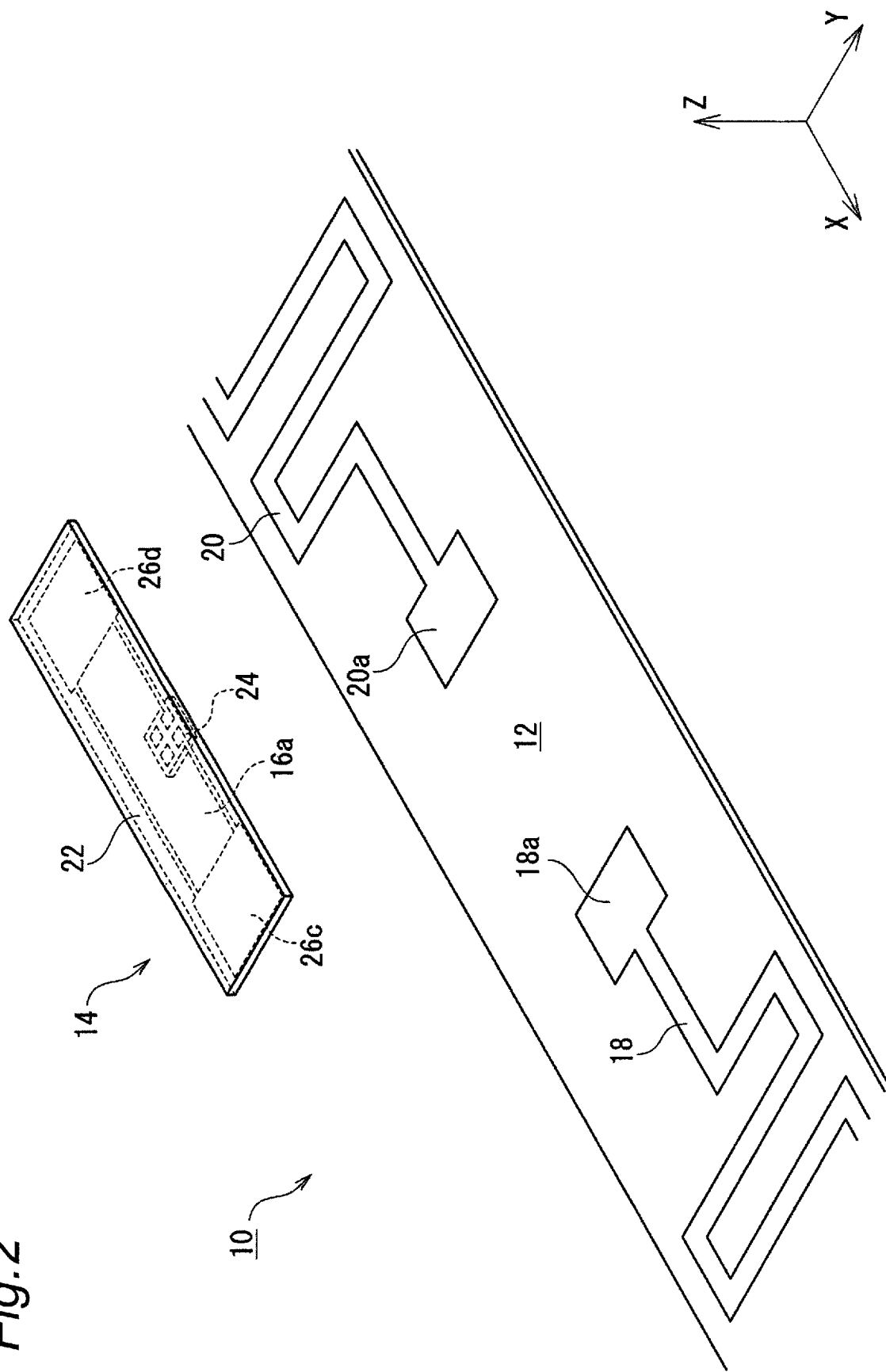
FIG. 2 is an exploded view of the RFID tag.

FIG. 1 is a perspective view of an RFID (Radio-Frequency IDentification) tag according to an exemplary embodiment of the present disclosure. FIG. 2 is an exploded view of the RFID tag. In an X-Y-Z coordinate system in the figures, an X-axis direction indicates a longitudinal direction, a Y-axis indicates a width direction, and a Z-axis indicates a thickness direction. This X-Y-Z coordinate system is for facilitating understanding of the invention and does not limit the invention.

As shown in FIG. 1, the RFID tag 10 has a belt shape and is configured to wirelessly communicate at a communication frequency in the UHF band. The RFID tag 10 has a belt-shaped main body part 12 (i.e. a main body) and an RFIC (Radio-Frequency Integrated Circuit) module 14 attached to the main body part 12.

As shown in FIG. 1, the band-shaped main body part 12 has a belt sheet shape and is made up of a film (e.g., PET film) made of a resin material, for example, or a flexible circuit board (FPC board). The main body part 12 is provided with an antenna element 16.

As shown in FIGS. 1 and 2, in the exemplary embodiment, the antenna element 16 is a conductor pattern and is disposed on a surface of the main body part 12. For example, when the main body part 12 is an FPC board, the antenna element 16 is fabricated by affixing a conductor sheet of copper etc. to the surface of the main body part 12 and performing photolithography and etching for the conductor sheet. For example, when the main body part 12 is a PET film, the antenna element 16 made of copper, silver, or aluminum is formed by foil stamping, screen printing, or the like. Alternatively, the antenna element 16 may be built into the main body part 12.

According to the exemplary embodiment, the antenna element 16 is made up of a first antenna pattern 18 and a second antenna pattern 20 independent of each other and functions as a dipole antenna. The first antenna pattern 18 and the second antenna pattern 20 each extend from a center in the longitudinal direction (X-axis direction) of the main body part 12 in directions opposite to each other toward an end portion. For this embodiment, the first antenna pattern 18 and the second antenna pattern 20 have a meander shape as shown in FIG. 1 for example.

As shown in FIG. 2, the first antenna pattern 18 and the second antenna pattern 20 have respective center-side ends in the longitudinal direction provided with a first antenna-side terminal 18a and a second antenna-side terminal 20a for connecting with the RFIC module 14 as described in detail later.

In the case of the first embodiment, as shown in FIG. 1, a cover seal 21 is affixed to the main body part 12 to cover the RFIC module 14 mounted on the main body part 12. This cover seal 21 maintains the RFIC module 14 fixed to the main body part 12 and protects the RFIC module 14. The cover seal 21 may have a size covering the entire surface of the main body part 12 provided with the antenna element 16. In this case, the antenna element 16 can entirely be protected. Regarding a manufacturing method of the RFID tag 10, in particular, a roll-to-roll method can be adopted as a method of affixing the cover seal 21 to the main body part 12 on which the RFIC module 14 is mounted.

Figure 3:
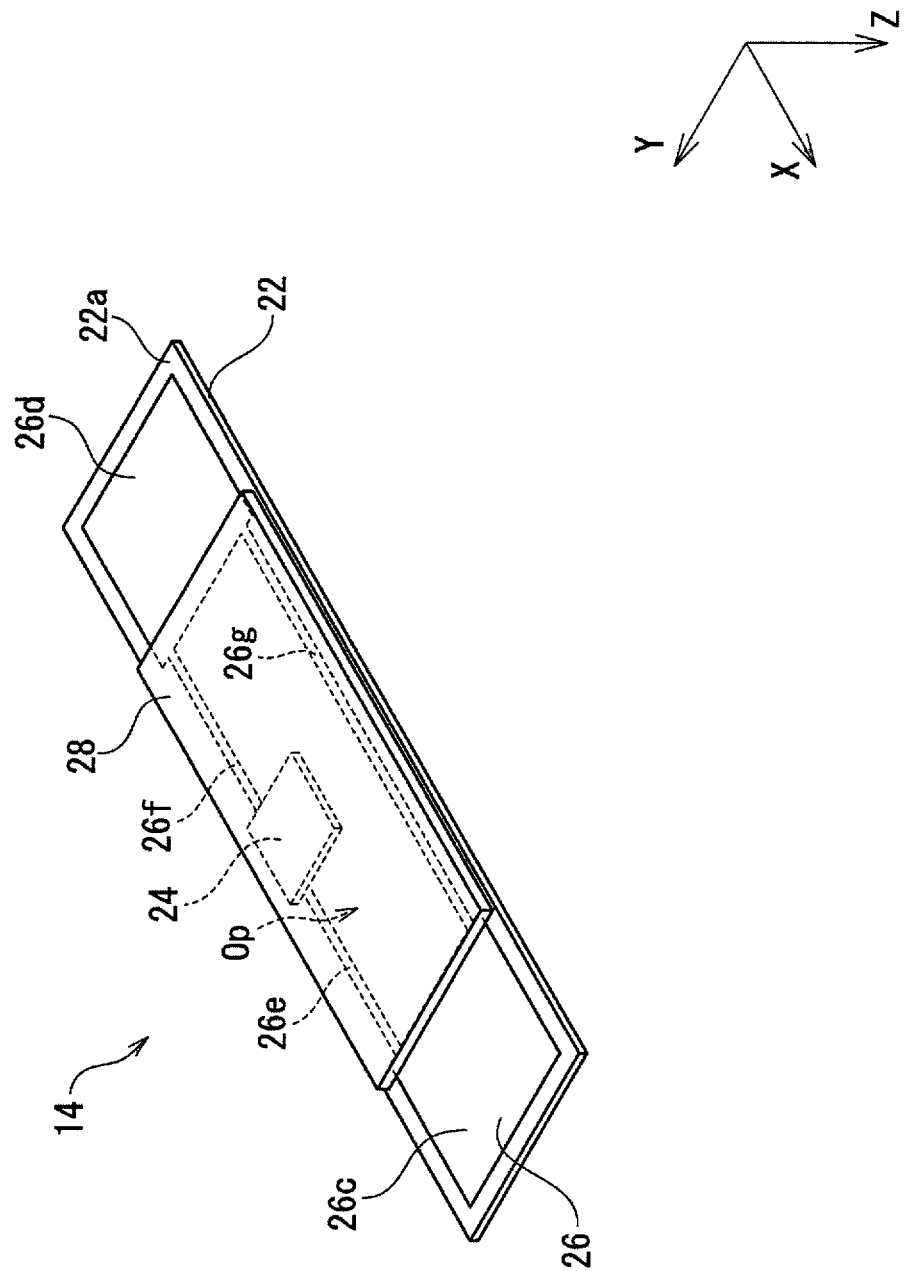
FIG. 3 is a perspective view of an RFIC module.
Figure 4:
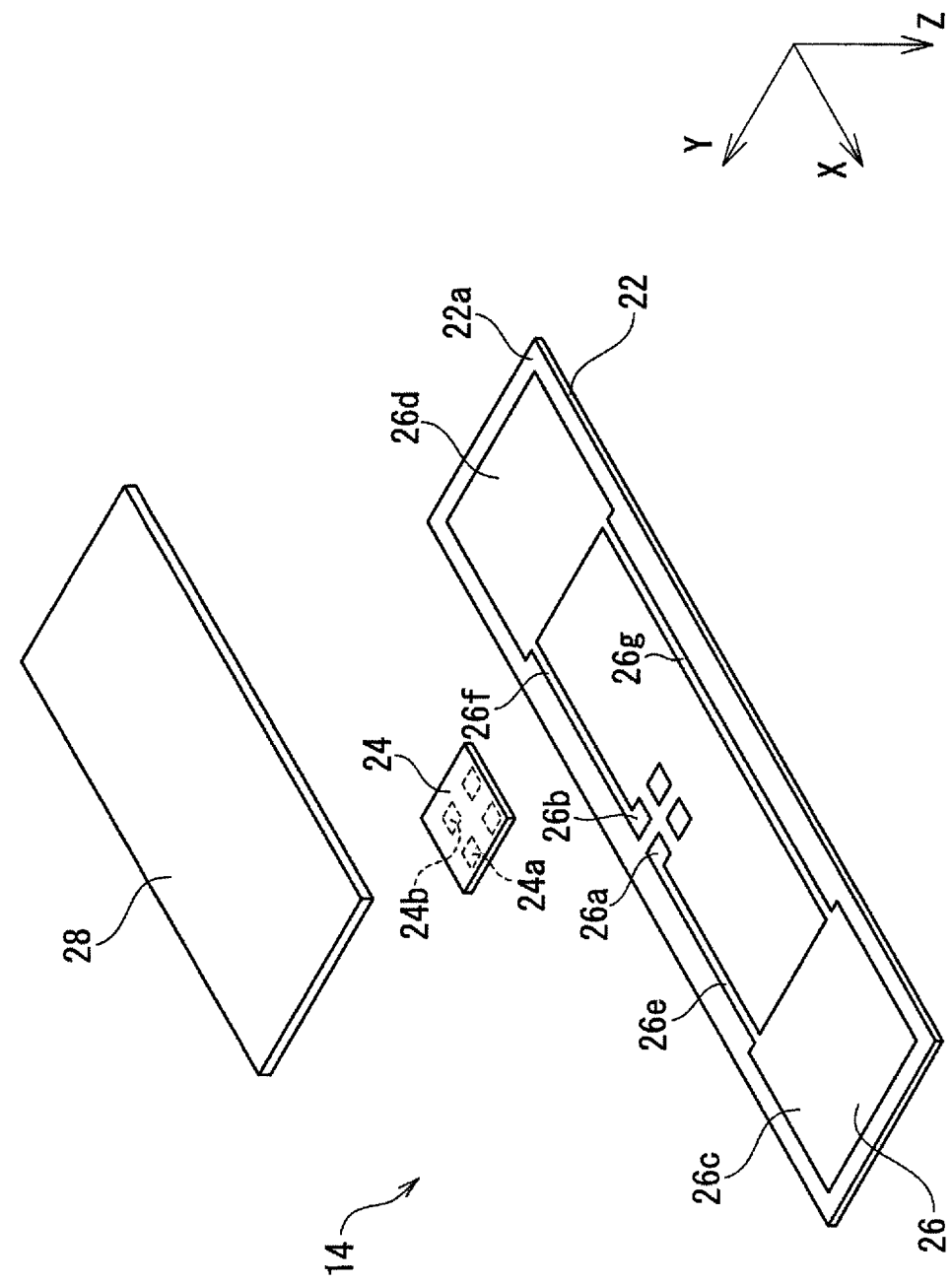
FIG. 4 is an exploded view of the RFIC module.
Figure 5:
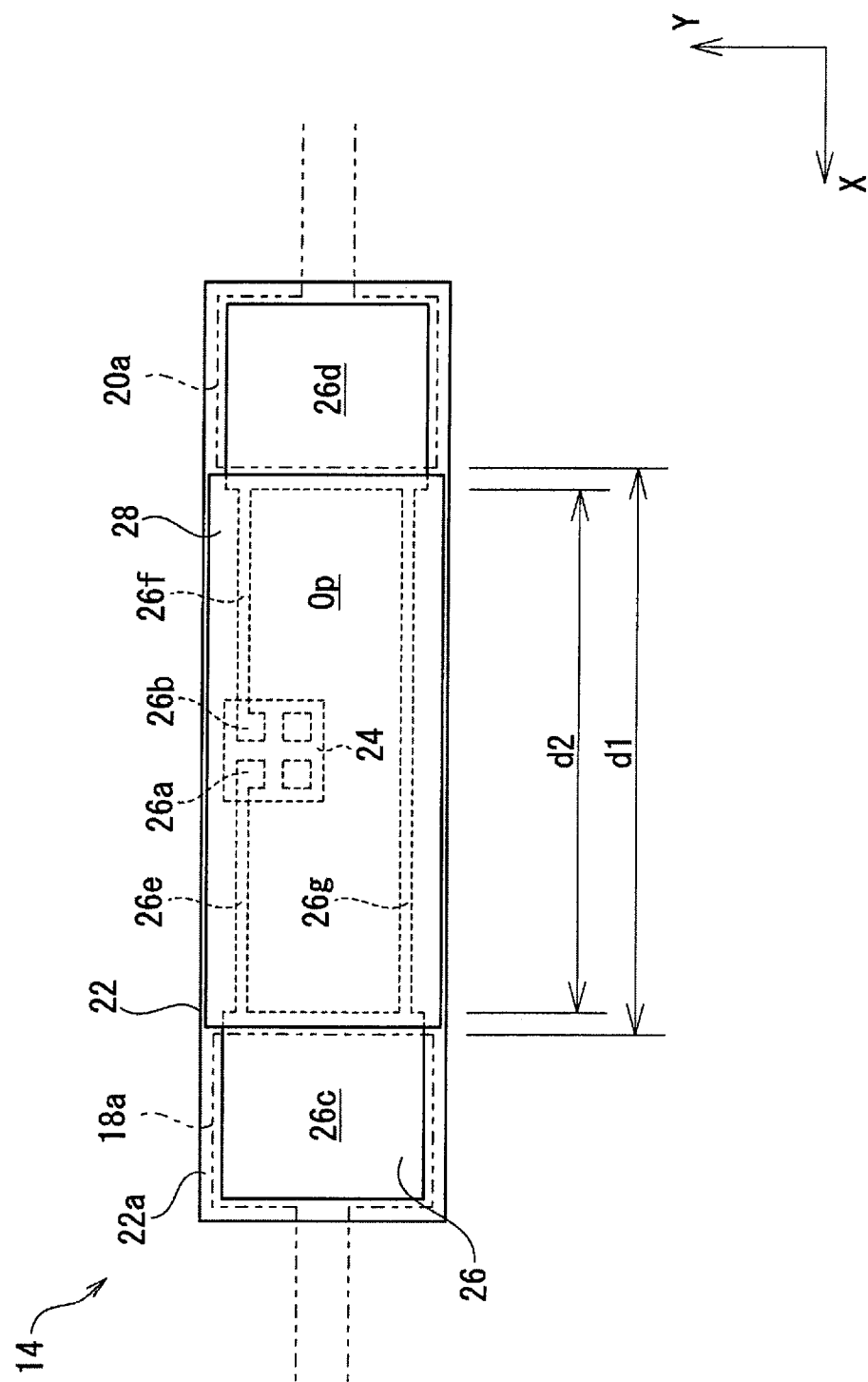
FIG. 5 is a plan view of the RFIC module.
Figure 6:
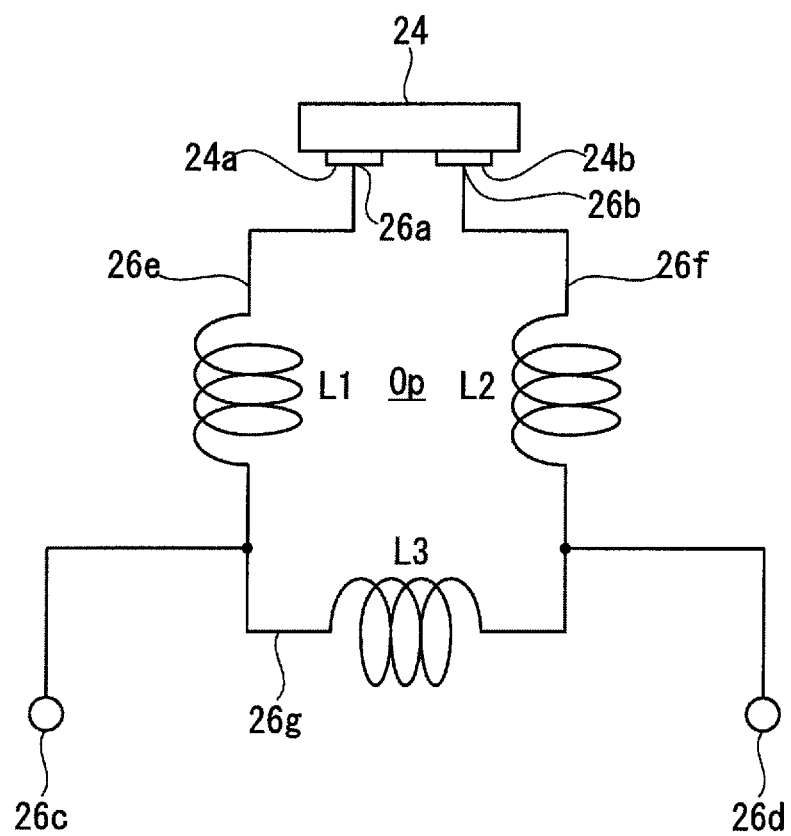
FIG. 6 is an equivalent circuit diagram of the RFIC module.

FIG. 3 is a perspective view of the RFIC module, FIG. 4 is an exploded view of the RFIC module, FIG. 5 is a plan view of the RFIC module, and FIG. 6 is an equivalent circuit diagram of the RFIC module.

As shown in FIGS. 3 to 5, for the exemplary embodiment, the RFIC module 14 has a base substrate 22 and an RFIC chip 24 mounted on the base substrate 22. The RFIC module 14 as described above is sometimes called a strap. Details of the RFIC module 14 will be described.

The base substrate 22 is a rectangular sheet having flexibility and is made up of a film (e.g., PET film) made of a resin material, for example, or a flexible circuit board (an FPC board). The base substrate 22 has a principal surface 22a on which the RFIC chip 24 is mounted. In the case of this embodiment, the RFIC module 14 is attached via the principal surface 22a to the main body part 12.

As shown in FIG. 3, the RFIC chip 24 is an IC chip and is configured to communicate with an external communication device (e.g., a reader/writer device of the RFID tag 10) via the antenna element 16. As shown in FIG. 4, the RFIC chip 24 includes a first input/output terminal 24a and a second input/output terminal 24b. In the case of the first embodiment, the RFIC chip 24 is located at the center in the longitudinal direction (X-axis direction) of the base substrate 22.

A conductor pattern 26 is disposed on the principal surface 22a of the base substrate 22. When the base substrate 22 is an FPC board, for example, the conductor pattern is fabricated by affixing a conductor sheet of copper, for example, onto the principal surface 16a and performing photolithography and etching for the conductor sheet. When the base substrate 22 is a PET film, the conductive pattern 26 can be made of copper, silver, or aluminum, for example, and can be formed on the principal surface 22a by etching processing, foil stamping, screen printing, or the like. For a surface of the conductor pattern, a gold flash plating treatment or a nickel/tin plating treatment may be performed, or a rust prevention treatment may be performed.

As shown in FIG. 4, the conductor pattern 26 disposed on the principal surface 22a of the base substrate 22 includes a first chip connection terminal 26a, a second chip connection terminal 26b, a first module-side terminal 26c, and a second module-side terminal 26d. Additionally, the conductor pattern 26 includes a first wiring pattern 26e, a second wiring pattern 26f, and a third wiring pattern 26g.

As shown in FIG. 4, the first chip connection terminal 26a and the second chip connection terminal 26b are disposed at the center in the longitudinal direction (X-axis direction) of the RFIC module 14 (the base substrate 22). The first chip connection terminal 26a and the second chip connection terminal 26b are connected to the first input/output terminal 24a and the second input/output terminal 24b, respectively, of the RFIC chip 24. The connection between the first chip connection terminal 26a and the first input/output terminal 24a as well as the connection between the second chip connection terminal 26b and the second input/output terminal 24b are made via solder or a conductive adhesive, for example.

Moreover, as further shown, the first module-side terminal 26c and the second module-side terminal 26d are disposed on the principal surface 22a of the base substrate 22, facing each other at an interval in the longitudinal direction (X-axis direction) of the RFIC module 14 (the base substrate 22). The first module-side terminal 26c and the second module-side terminal 26d are connected to the first antenna-side terminal 18a and the second antenna-side terminal 20a, respectively, of the antenna element 16 (the first antenna pattern 18 and the second antenna pattern 20).

According to the exemplary aspect, the connection between the first module-side terminal 26c and the first antenna-side terminal 18a as well as the connection between the second module-side terminal 26d and the second antenna-side terminal 20a are made via solder or a conductive adhesive, for example. Alternatively, the connections can be made by affixing the cover seal 21 to the main body part 12 so as to cover the RFIC module 14 while maintaining these electrical contacts. As a result, the first and second antenna-side terminals 18a, 20a and the first and second module-side terminals 26c, 26d are connected in terms of a direct current.

Instead of being connected in terms of a direct current, the first and second antenna-side terminals 18a, 20a and the first and second module-side terminals 26c, 26d can also be capacitively be coupled via an insulating adhesive or a double-sided tape.

According to the exemplary embodiment, the base substrate 22 of the RFIC module 14 has flexibility, so that the principal surface 22a of the base substrate 22 can entirely be brought into close contact with the main body part 12 such that the first and second antenna-side terminals 18a, 20a are sandwiched therebetween. By attaching the RFIC module 14 to the main body part 12 with the entire surface brought into close contact, the RFID tag 10 is highly improved in rigidity, and the connection can further be protected and maintained between the first and second antenna-side terminals 18a, 20a and the first and second module-side terminals 26c, 26d (as compared to when the principal surface 22a is separated from the main body part 12).

As shown in FIG. 4, in the case of this embodiment, the first wiring pattern 26e is a linear conductor pattern and extends between and connects the first module-side terminal 26c and the first chip connection terminal 26a in the longitudinal direction (X-axis direction) of the RFIC module 14.

In the case of this embodiment, the second wiring pattern 26f is a linear conductor pattern and extends between and connects the second module-side terminal 26d and the second chip connection terminal 26b in the longitudinal direction (X-axis direction) of the RFIC module 14.

In the case of this embodiment, the third wiring pattern 26g is a linear conductor pattern and extends between and connects the first module-side terminal 26c and the second module-side terminal 26d in the longitudinal direction (X-axis direction) of the RFIC module 14.

Therefore, as shown in FIG. 3, a conductor loop including a loop opening Op is formed of the first module-side terminal 26c, the first wiring pattern 26e, the RFIC chip 24, the second wiring pattern 26f, the second module-side terminal 26d, and the third wiring pattern 26g.

As shown in the circuit diagram of FIG. 6, the first wiring pattern 26e, the second wiring pattern 26f, and the third wiring pattern 26g have inductances L1, L2, and L3, respectively. A matching circuit for impedance matching between the antenna element 16 and the RFIC chip 24 is formed by these inductances L1 to L3. The first wiring pattern 26e, the second wiring pattern 26f, and the third wiring pattern 26g have lengths and thicknesses decided for matching at the communication frequency of the UHF band of the RFID tag 10, i.e., for acquiring the inductances L1, L2, and L3 required for this purpose. More specifically, in this matching circuit, a resonance circuit is formed by a capacitance component of the RFIC chip itself and the inductance components (L1, L2, L3) of the wiring patterns, and the inductance components of the wiring patterns are set such that the resonance frequency of this resonance circuit substantially corresponds to the communication frequency.

Therefore, the matching circuit of the RFID tag 10 is disposed on the RFIC module 14 side instead of the main body part 12 side. Consequently, a matching pattern such as a loop part is not necessarily required on the main body part 12 side serving as an antenna substrate. Thus, even if the RFIC module 14 is displaced when attached to the main body part 12, or a connection resistance value is several Ω between the module-side terminals 26c, 26d and the antenna-side terminals 18a, 20a, or even if an object with relatively high permittivity or a metal object is present near the main body part 12 serving as the antenna substrate, the communication characteristics of the RFID tag 10 are substantially not affected (as compared to when a matching circuit is formed over both the main body part 12 and the RFIC module 14 or when a matching circuit is formed only on the main body part 12 side). Additionally, RFID tags different in communication characteristics such as RFID tags different in communication distance and RFID tags different in shape can easily be configured by simply attaching different antenna elements to the RFIC module 14.

According to the exemplary embodiment, the RFID tag 10 is configured such that considerations are given to variations in attachment of the RFIC module 14 to the main body part 12. Specifically, as shown in FIG. 5, a distance d1 between the first antenna-side terminal 18a and the second antenna-side terminal 20a is larger than a distance d2 between the first module-side terminal 26c and the second module-side terminal 26d.

If the distances d1, d2 are equal and the RFIC module 14 is displaced in the longitudinal direction (X-axis direction) when attached to the main body part 12, one of the first module-side terminal 26c and the second module-side terminal 26d overlaps the loop opening Op of the conductor loop. As a result, such an overlap will change a current flowing through the conductor loop made up of the first module-side terminal 26c, the first wiring pattern 26e, the RFIC chip 24, the second wiring pattern 26f, the second module-side terminal 26d, and the third wiring pattern 26g (as compared to when no overlap occurs). Thus, as a further result, the frequency characteristics of the RFID tag 10 changes depending on an amount of overlap with the loop opening Op, and consequently, variations occur in the communication characteristics of the RFID tag 10.

As a countermeasure, the distance d1 between the first antenna-side terminal 18a and the second antenna-side terminal 20a is made larger than the distance d2 between the first module-side terminal 26c and the second module-side terminal 26d. As a result, even if variations occur in the attachment of the RFIC module 14 to the main body part 12, one of the first module-side terminal 26c and the second module-side terminal 26d is restrained from overlapping the loop opening Op of the conductor loop (as compared to when the distances d1, d2 are equal). If the RFIC module 14 can be attached to the main body part 12 with high accuracy (with high reproducibility), the distances d1, d2 may be equal.

To protect the first wiring pattern 26e, the second wiring pattern 26f, and the third wiring pattern 26g forming the matching circuit as described above and, additionally, to protect the RFIC chip 24, in this embodiment, the RFIC module 14 further includes a protective layer 28 as shown in FIGS. 3 to 5.

The protective layer 28 is a flexible sheet made of an insulating material, for example, and is disposed on, for example, has an entire surface affixed to, the principal surface 22a of the base substrate 22 to cover and protect the RFIC chip 24, the first wiring pattern 26e, the second wiring pattern 26f, and the third wiring pattern 26g.

In the case of this embodiment, as shown in FIG. 5, the protective layer 28 covers and protects the first and second module-side terminals 26c, 26d as well, except portions connected to the first and second antenna-side terminals 18a, 20b of the antenna element 16. Specifically, the protective layer 28 protects a connecting portion between the first module-side terminal 26c and the first wiring pattern 26e, a connecting portion between the second module-side terminal 26d and the second wiring pattern 26f, a connecting portion between the first module-side terminal 26c and the third wiring pattern 26g, and a connecting portion between the second module-side terminal 26d and the third wiring pattern 26g.

If the first and second antenna-side terminals 18a, 20a of the antenna element 16 are capacitively coupled to the first and second module-side terminals 26c, 26d as described above, the protective layer 28 may entirely cover the first and the second module-side terminals 26c, 26d, i.e., may entirely cover the principal surface 22a of the base substrate 22.

If the main body part 12 has flexibility, the main body part 12 can thus be configured to be brought into close contact with the principal surface 22a of the base substrate 22 of the RFIC module 14, and therefore, the protective layer 28 may not be included. Specifically, since the RFIC chip 24 and the conductor pattern 26 are disposed between the main body part 12 of the RFID tag 10 and the base substrate 22 of the RFIC module 14, the RFIC chip 24 and the conductor pattern 26 can be protected by the main body part 12 instead of the protective layer 28.

Regarding the protection, in the case of this embodiment, as shown in FIG. 5, the RFIC chip 24, the first wiring pattern 26e, the second wiring pattern 26f, and the third wiring pattern 26g are located in a region on the principal surface 22a of the base substrate 22 interposed between the first module-side terminal 26c and the second module-side terminal 26d.

In this case, the first module-side terminal 26c and the second module-side terminal 26d play a role in suppression of deformation caused by application of a load to the RFIC module 14 from the outside, for example, the deformation of the base substrate 22 forming a valley line extending in the longitudinal direction (X-axis direction). As a result, deformation is suppressed in the portion of the base substrate 22 interposed between the first module-side terminal 26c and the second module-side terminal 26d. Consequently, damage, such as disconnection, is suppressed in the RFIC chip 24, the first wiring pattern 26e, the second wiring pattern 26f, and the third wiring pattern 26g located in the portion.

According to the RFID tag 10 configured as described above, when the antenna element 16 receives a radio wave (i.e., a signal), a current is generated (i.e., induced) in the antenna element 16, and the current is supplied through the conductor pattern 26 to the RFIC chip 24. The RFIC chip 24 receiving the supply of the current is driven and supplies a signal (current) corresponding to information stored in an internal storage part (memory) through the conductor pattern 26 to the antenna element 16. The antenna element 16 receiving the supply of the current radiates a radio wave (signal).

According to the exemplary embodiment as described above, a simple structure can be implemented in the RFIC module 14 of the RFID tag 10 as compared with conventional designs.

Specifically, as shown in FIGS. 3 and 4, the RFIC module 14 can be implemented in a single layer structure. Additionally, the RFIC chip 24 and the conductor pattern 26 may be disposed only on the principal surface 22a of the base substrate 22. Specifically, the need for an interlayer connection conductor such as a via hole conductor penetrating the base substrate 22 is eliminated. Furthermore, a matching circuit for matching between the antenna element 16 and the RFIC chip 24 is formed by the conductor pattern 26 disposed on the principal surface 22a of the base substrate 22.

Therefore, since the RFID tag 10 having a simple structure as described above can easily be fabricated with high accuracy, stable communication characteristics can be acquired, and the thickness can easily be reduced. Regarding manufacturing thereof, a defect rate and costs can be made lower.

Although the present invention has been described with reference to the exemplary embodiment, it is noted that the embodiments of the present disclosure are not limited thereto.

For example, in the case of the exemplary embodiment as shown in FIG. 2, the RFIC module 14 is disposed on the main body part 12 such that the principal surface 22a provided with the RFIC chip 24 faces the main body part 12. Therefore, the first module-side terminal 26c and the first antenna-side terminal 18a can be connected in terms of a direct current, and the second module-side terminal 26d and the second antenna-side terminal 20a can be connected in terms of a direct current. However, the exemplary embodiments of the present invention are not limited thereto. Alternatively, the RFIC module 14 may be disposed on the main body part 12 such that the back surface of the base substrate 22 opposite to the principal surface 22a provided with the RFIC chip 24 faces thereto. In this case, the first module-side terminal 26c and the first antenna-side terminal 18a are capacitively coupled across the base substrate 22. Similarly, the second module-side terminal 26d and the second antenna-side terminal 20a are capacitively coupled across the base substrate 22.

For example, as shown in FIG. 4, in the case of the embodiment, the first wiring pattern 26e, the second wiring pattern 26f, and the third wiring pattern 26g of the RFIC module 14 have a linear shape; however, the embodiments of the present invention are not limited thereto.

Figure 7:
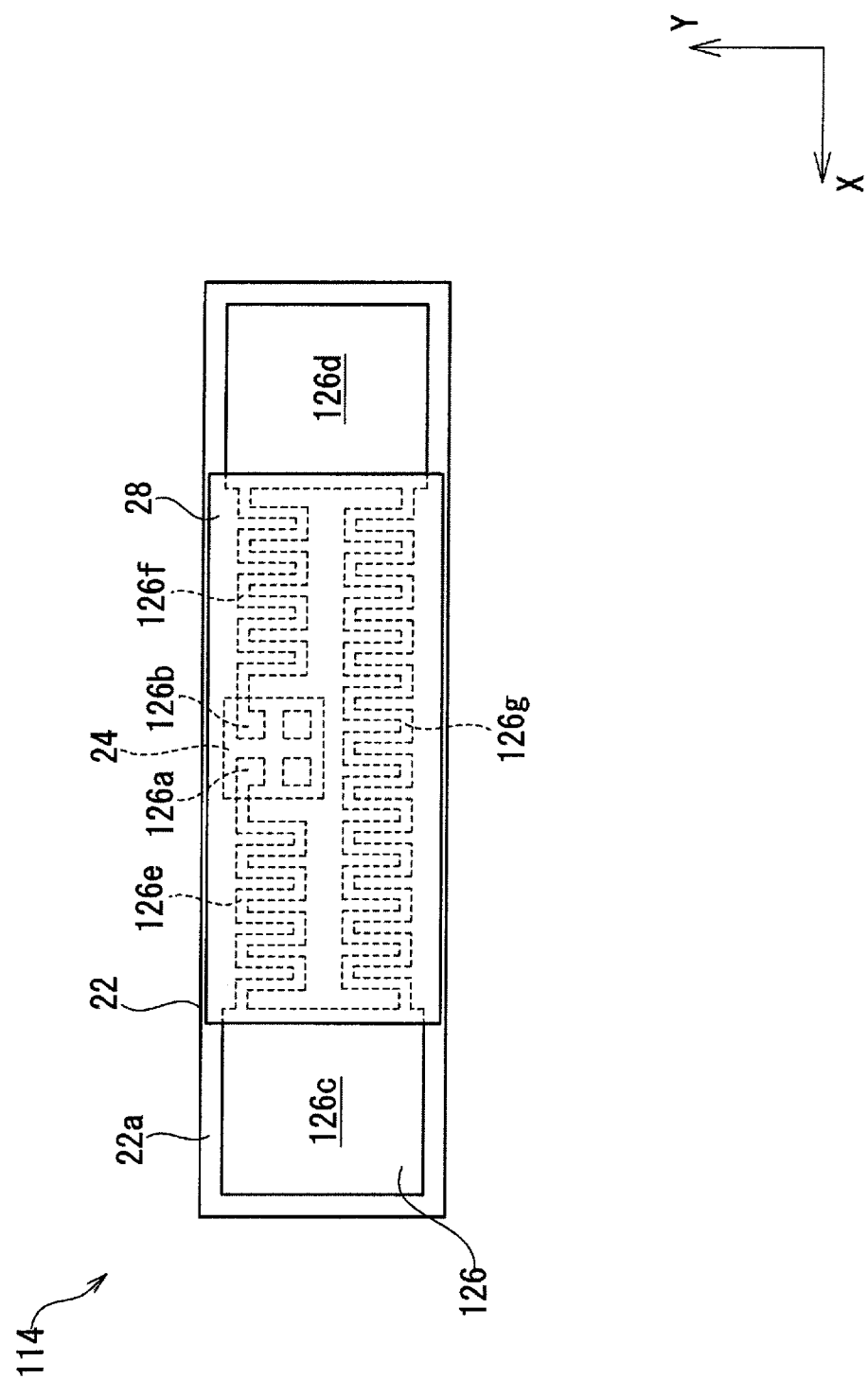
FIG. 7 is a plan view of an RFIC module according to another exemplary embodiment.

FIG. 7 is a plan view of an RFIC module according to another exemplary embodiment.

As shown in FIG. 7, an RFIC module 114 according to this embodiment has a first wiring pattern 126e, a second wiring pattern 126f, and a third wiring pattern 126g each formed into a meander shape.

Due to the meander shape of each wiring pattern, each of the first to third wiring patterns can be increased in inductance. Additionally, since the patterns having the inductances have the meander shape, a linear distance from one end to the other end can be reduced in the patterns (as compared to when the patterns have the linear shape). As a result, while each of the wiring patterns has necessary inductance, the RFIC module can be reduced in the size in the extending direction of the patterns. Therefore, the RFID tag can be miniaturized according to this configuration.

Moreover, when the RFIC module includes a protective layer as in the RFIC module 14 including the protective layer 28 covering the first to third wiring patterns 26e, 26f, and 26g shown in FIG. 3, the protective layer can contain a magnetic filler according to an exemplary aspect. This configuration can also increase the inductances of the first to third wiring patterns.

If the first to third wiring patterns have the meander shape, the capacitance can be increased between the first wiring pattern and the third wiring pattern as well as between the second wiring pattern and the third wiring pattern.

Figure 8:
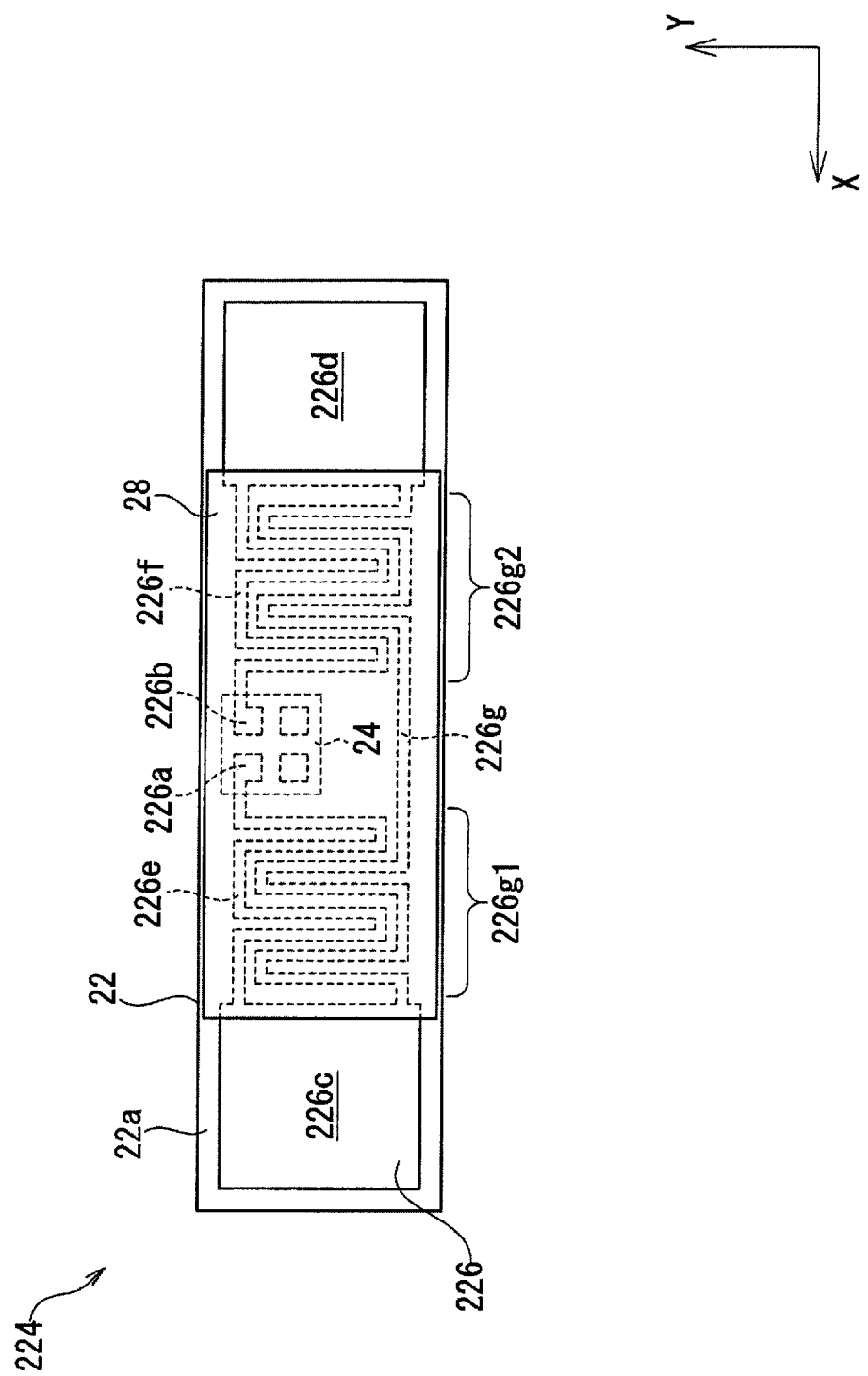
FIG. 8 is a plan view of an RFIC module according to a further embodiment.

FIG. 8 is a plan view of an RFIC module according to another exemplary embodiment.

As shown in FIG. 8, in an RFIC module 214 according to this embodiment has a first wiring pattern 226e, a second wiring pattern 226f, and a third wiring pattern 226g each formed into a meander shape. The first wiring pattern 226e and one side portion 226g1 of the third wiring pattern 226g extend in a meandering manner toward the first module-side terminal 226c while maintaining a constant distance therebetween. Similarly, the second wiring pattern 226f and the other side portion 226g2 of the third wiring pattern 226g extend in a meandering manner toward the second module-side terminal 226d while maintaining a constant distance therebetween. In the case of the embodiment shown in FIG. 8, each of the first to third wiring patterns 226e, 226f, and 226g has a rectangular wave shape, and a distance between the first and second wiring patterns 226e, 226g and the third wiring pattern 226g is substantially entirely kept constant. It is noted that the distance between the first and second wiring patterns 226e, 226g and the third wiring pattern 226g may entirely be kept constant or may partially be kept constant.

Such a pattern layout can increase the capacitance between the first wiring pattern 226e and the third wiring pattern 226g and the capacitance between the second wiring pattern 226f and the third wiring pattern 226g. This expands the frequency band usable for wireless communication of the RFIC tag and consequently improves the versatility of the RFID tag.

Additionally, according to the exemplary embodiment, as shown in FIG. 4, the first chip connection terminal 26a, the second chip connection terminal 26b, the first module-side terminal 26c, the second module-side terminal 26d, the first wiring pattern 26e, the second wiring pattern 26f, and the third wiring pattern 26g are integrated as one conductor pattern. However, the exemplary embodiments of the present invention are not limited thereto. For example, any one thereof can be made of a different material from the rest. This makes the adjustment of reactance of the wiring patterns easier. On the other hand, if these terminals and wiring patterns are integrated as one conductor pattern, the impedance therebetween can be made zero.

Furthermore, in the case of the embodiment, as shown in FIG. 1, the antenna element 16 (the first antenna pattern 18 and the second antenna pattern 20) has a meander shape; however, the embodiments of the present invention is not limited thereto. For example, the antenna element may have a linear shape.

Additionally, the RFID tag according to the embodiment of the present invention may be a metal-compatible RFID tag usable even when attached to a metal surface of an article.

Figure 9:
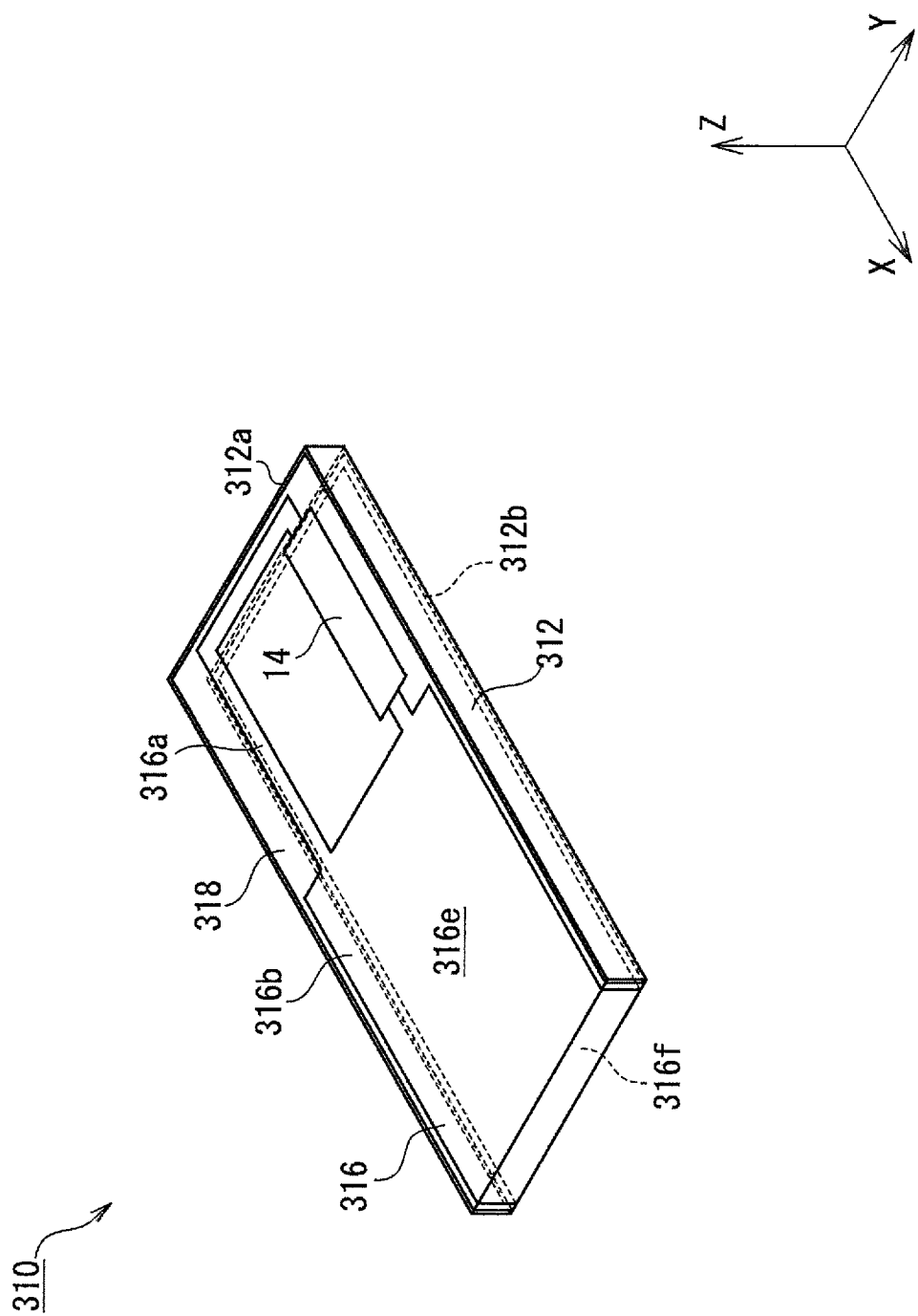
FIG. 9 is a perspective view of an exemplary metal-compatible RFID tag according to a another exemplary embodiment.
Figure 10:
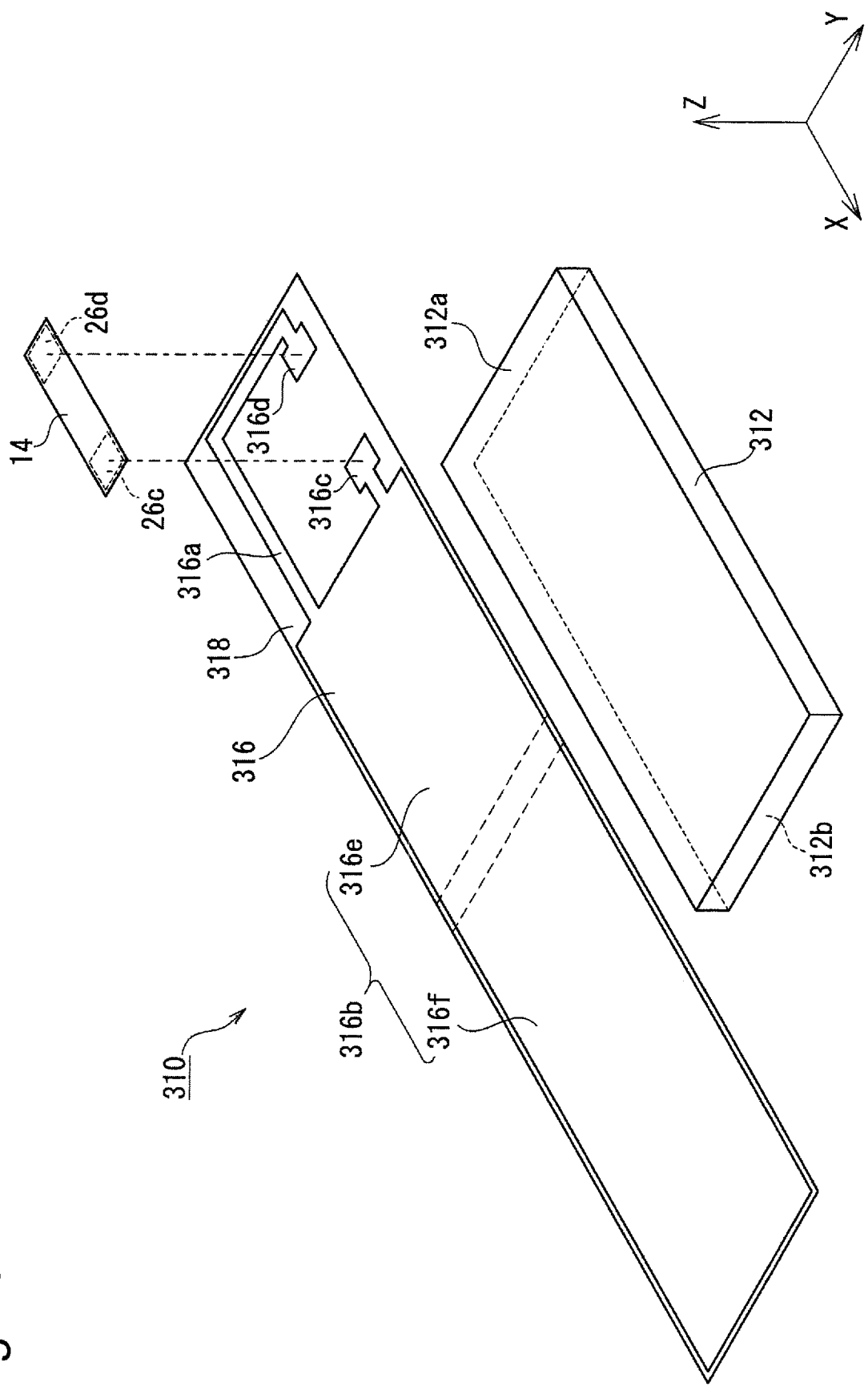
FIG. 10 is an exploded perspective view of the exemplary metal-compatible RFID tag.

FIG. 9 is a perspective view of an exemplary metal-compatible RFID tag according to another exemplary embodiment. FIG. 10 is an exploded perspective view of the exemplary metal-compatible RFID tag.

An RFID tag 310 shown in FIG. 9 is a metal-compatible RFID tag capable of performing wireless communication even when attached to a metal surface of an article and is specifically configured such that the metal surface can be used as a radio-wave radiation surface.

As shown in FIG. 10, the RFID tag 310 has a main body part 312, the RFIC module 14, and an antenna element 316. The RFIC module used for the RFID tag 310 may be the RFIC module 114 or 214 in the embodiments.

The main body part 312 is made of a dielectric material and is a rectangular board, for example. The main body part 312 includes a module-mounting surface 312a on which the RFIC module 14 is mounted and an attachment surface 312b attached to a metal surface of an article.

In the case of this embodiment, the antenna element 316 is made up of a conductor pattern disposed on an antenna-supporting sheet 318 having flexibility, or specifically, having a sheet shape that can be wrapped around the main body part 312. The antenna-supporting sheet 318 is a film (e.g., PET film) made of a resin material, for example. For example, the antenna element 316 is formed on the antenna-supporting sheet 318 by etching processing, foil stamping, screen printing, etc. By wrapping the antenna-supporting sheet 318 as described above around the main body part 312, the antenna element 316 is disposed on the main body part 312.

The antenna element 316 may be fabricated by punching of a metal sheet instead of the conductor pattern. Moreover, the antenna element 316 can be disposed directly on the main body part 312 without interposition of the antenna-supporting sheet 318.

For this exemplary embodiment, the antenna element 316 includes a loop part 316a and a belt-shaped part 316b. As shown in FIG. 10, the loop part 316a has both ends respectively provided with a first antenna-side terminal 316c connected to the first module-side terminal 26c of the RFIC module 14 and a second antenna-side terminal 316d connected to the second module-side terminal 26d.

The belt-shaped part 316b of the antenna element 316 is connected at one end to the loop part 316a and extends in the longitudinal direction (X-axis direction) of the RFID tag 310. The belt-shaped part 316b extends from the module-mounting surface 312a of the main body part 312 to the attachment surface 312b. Specifically, the belt-shaped part 316b is folded back at one end in the longitudinal direction (X-axis direction) of the main body part 312 and therefore includes a first portion 316e arranged on the module-mounting surface 312a together with the RFIC module 14 and a second portion 316f arranged on the attachment surface 312b. In the case of this embodiment, the second portion 316f of the belt-shaped part 316b is disposed entirely on the attachment surface 312b.

According to the RFID tag 310 as described above, when the RFID tag 310 is attached to a metal surface of an article by the attachment surface 312b of the main body part 312, the second portion 316f of the belt-shaped part 316b of the antenna element 316 is disposed to face the metal surface of the article. If the RFID tag 310 is attached to the metal surface of the article via a conductive member such as a conductive double-sided tape etc., the second portion 316f of the belt-shaped part 316b of the antenna element 316 can be connected to the metal surface in terms of a direct current. Alternatively, if attached via an insulating member such as an insulating double-sided tape, the second portion 316f can capacitively be coupled to the metal surface.

The second portion 316f of the belt-shaped part 316b of the antenna element 316 is connected in terms of a direct current, or capacitively coupled, to the metallic surface of the article, so that the RFID tag 310 can utilize the metallic surface of the article as a radio-wave radiation surface. As a result, the RFID tag 310 can perform wireless communication at a longer communication distance (as compared to when not attached to the metal surface of the article).

The metal-compatible RFID tag according to the embodiment of the present invention is not limited to the RFID tag 310 shown in FIGS. 9 and 10.

Figure 11:
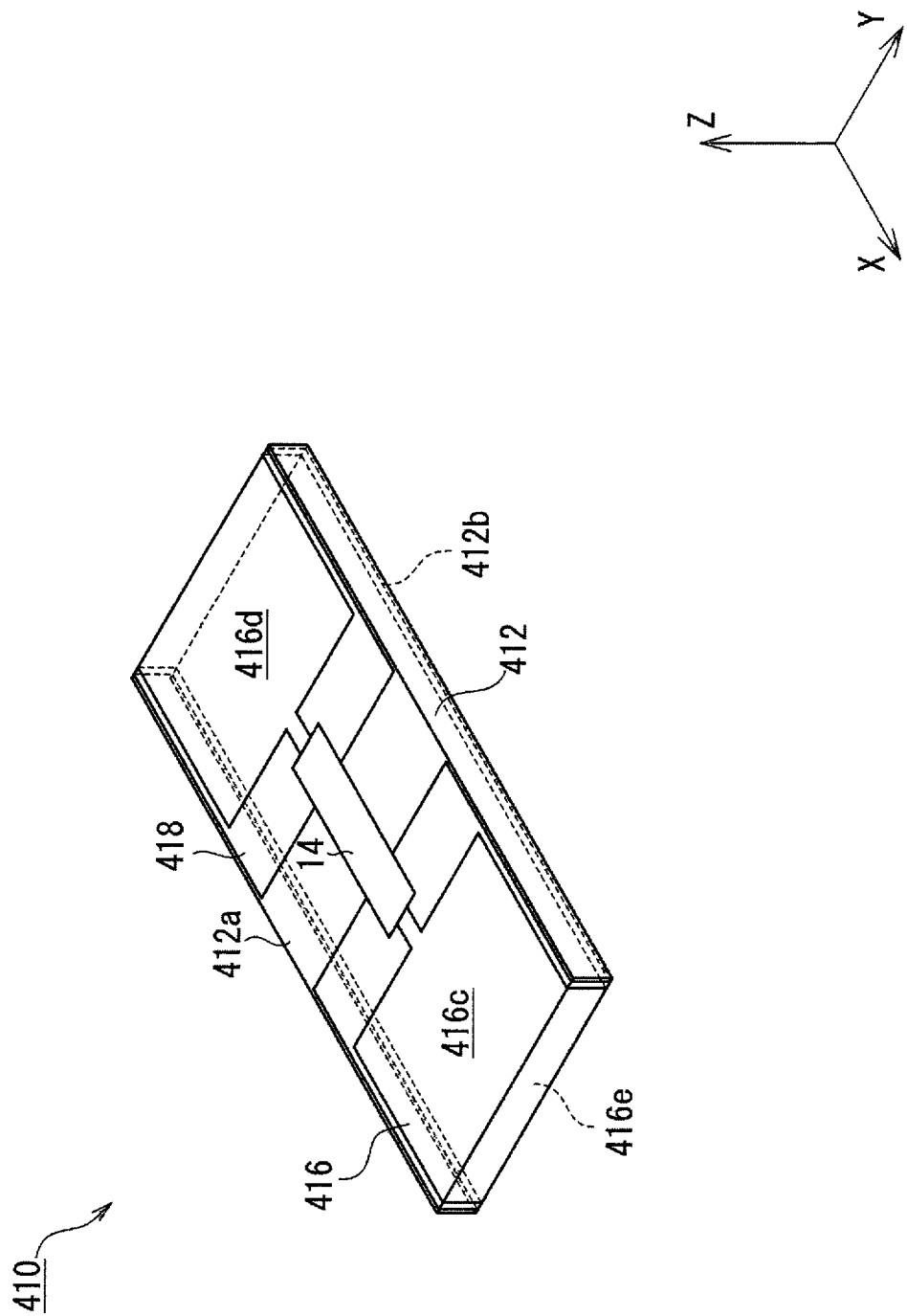
FIG. 11 is a perspective view of another exemplary metal-compatible RFID tag.
Figure 12:
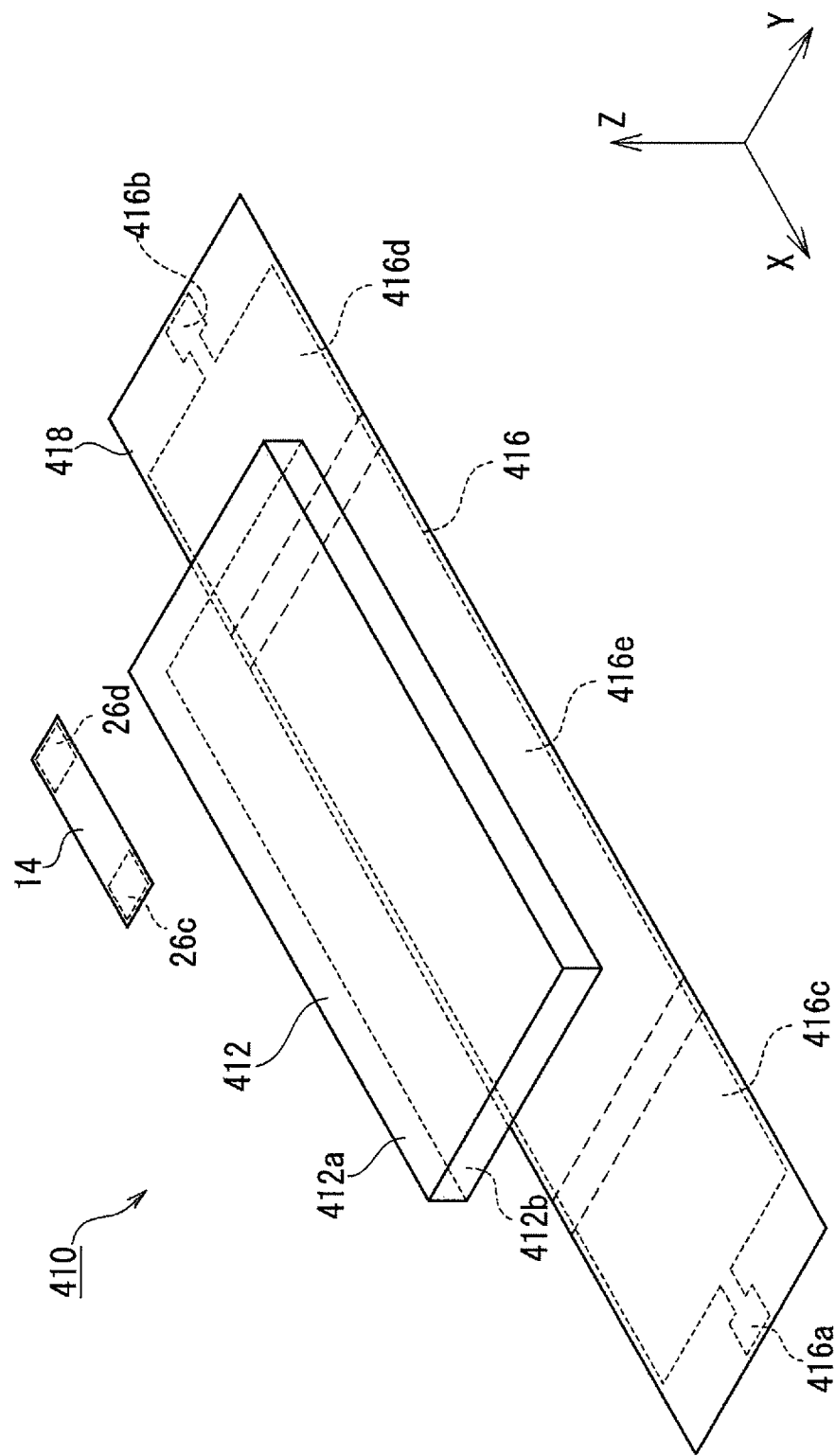
FIG. 12 is an exploded perspective view of the other exemplary metal-compatible RFID tag.

FIG. 11 is a perspective view of another exemplary metal-compatible RFID tag. FIG. 12 is an exploded perspective view of the other exemplary metal-compatible RFID tag.

An RFID tag 410 shown in FIG. 11 is also a metal-compatible RFID tag capable of performing wireless communication even when attached to a metal surface of an article and is specifically configured such that the metal surface can be used as a radio-wave radiation surface.

As shown in FIG. 12, the RFID tag 410 includes a main body part 412, the RFIC module 14, and an antenna element 416.

The main body part 412 is made of a dielectric material and is a rectangular board, for example. The main body part 412 includes a module-mounting surface 412a on which the RFIC module 14 is mounted and an attachment surface 412b attached to a metal surface of an article.

The antenna element 416 is made up of a conductor pattern disposed on a sheet-shaped antenna-supporting sheet 418 that can be wrapped around the main body part 412. By wrapping the antenna-supporting sheet 418 as described above around the main body part 412, the antenna element 416 is disposed on the main body part 412.

According to an exemplary aspect of this embodiment, the antenna element 416 has a belt shape and has both ends provided with a first antenna-side terminal 416a connected to the first module-side terminal 26c of the RFIC module 14 and a second module-side terminal and a second antenna-side terminal 416b connected to the second module-side terminal 26d. The antenna element 416 is folded back at both ends in the longitudinal direction (X-axis direction) of the main body part 412 and therefore includes a first portion 416c and a second portion 416d arranged on both sides of the module-mounting surface 412a of the main body part 412 as well as a third portion 416e connecting the first portion 416c and the second portion 416d and arranged on the attachment surface 412b.

According to the RFID tag 410 as described above, the third portion 416e of the antenna element 416 can be connected in terms of a direct current, or can capacitively be coupled, to the metal surface of the article. Therefore, the RFID tag 410 can utilize the metal surface of the article as a radio-wave radiation surface. As a result, the RFID tag 410 can perform wireless communication at a longer communication distance (as compared to when not attached to the metal surface of the article).

The antenna element 316 of the RFID tag 310 shown in FIG. 10 and the antenna element 416 of the RFID tag 410 shown in FIG. 12 are constituted by one conductor pattern; however, the antenna element of the metal-compatible RFID tag is not limited thereto.

Figure 13:
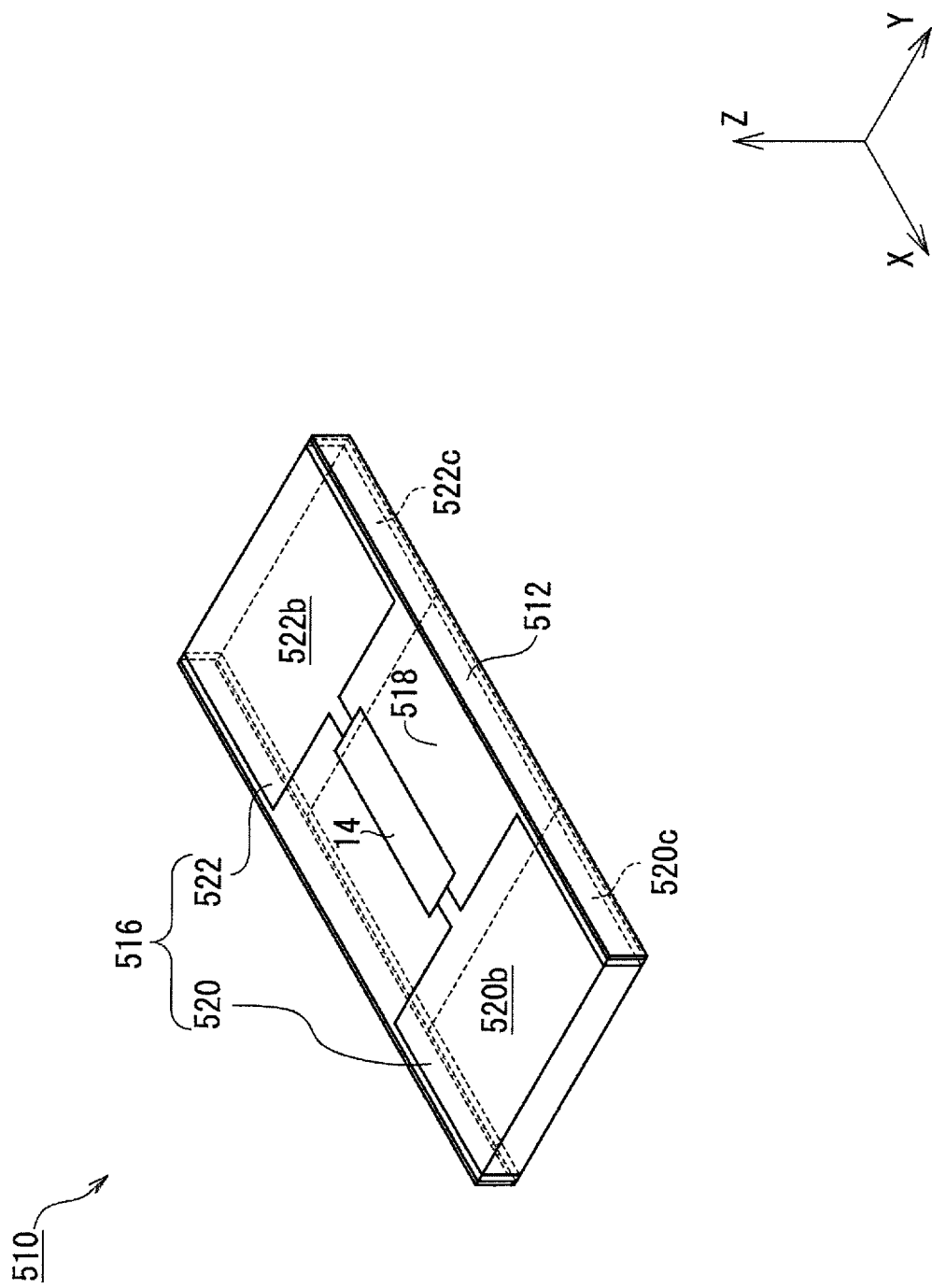
FIG. 13 is a perspective view of a further exemplary metal-compatible RFID tag.
Figure 14:
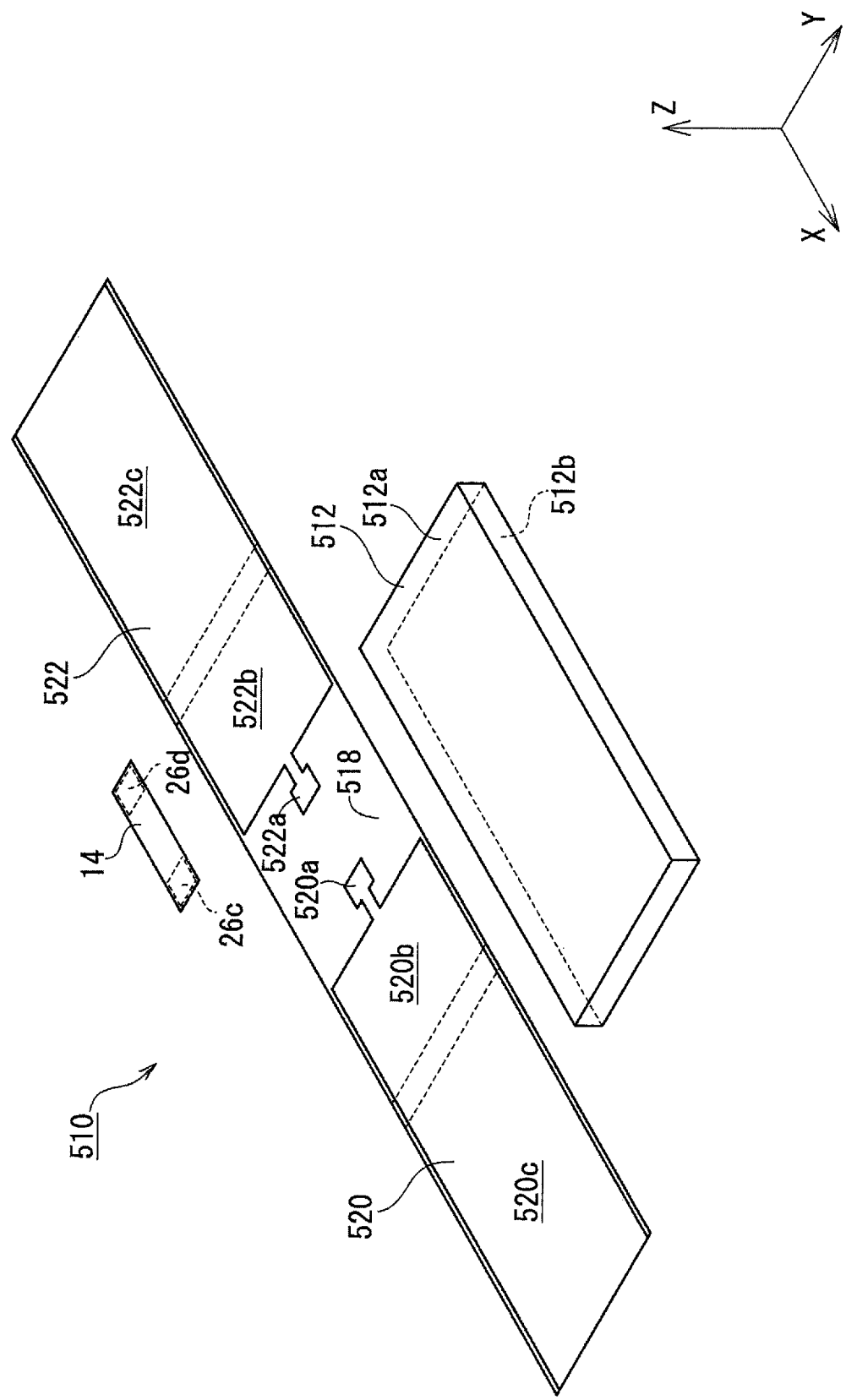
FIG. 14 is an exploded perspective view of the further exemplary metal-compatible RFID.

FIG. 13 is a perspective view of a further exemplary metal-compatible RFID tag. FIG. 14 is an exploded perspective view of the further exemplary metal-compatible RFID.

An RFID tag 510 shown in FIG. 13 is also a metal-compliant RFID tag capable of performing wireless communication even when attached to a metal surface of an article and is specifically configured such that the metal surface can be used as a radio-wave radiation surface.

As shown in FIG. 14, the RFID tag 510 includes a main body part 512, the RFIC module 14, and an antenna element 516.

The main body part 512 is made of a dielectric material and is a rectangular board, for example. The main body part 512 includes a module-mounting surface 512a on which the RFIC module 14 is mounted and an attachment surface 512b attached to a metal surface of an article.

For this embodiment, the antenna element 516 can be formed of a conductor pattern disposed on a sheet-shaped antenna-supporting sheet 518 that can be wrapped around the main body part 512. By wrapping the antenna-supporting sheet 518 around the main body part 512, the antenna element 516 is disposed on the main body part 512.

In the case of this embodiment, the antenna element 516 comprises a first antenna pattern 520 and a second antenna pattern 522 independent of each other. As shown, the first antenna pattern 520 has a belt shape and is provided with an antenna-side terminal 520a connected to the first module-side terminal 26c of the RFIC module 14, at an end on the center side in the longitudinal direction (X-axis direction) of the main body part 512. The first antenna pattern 520 is folded back at one end in the longitudinal direction of the main body part 512 and therefore includes a first portion 520b arranged on the module-mounting surface 512a of the main body part 512 and a second portion 520c arranged on the attachment surface 512b.

The second antenna pattern 522 of the antenna element 516 also has a belt shape and is provided with an antenna-side terminal 522a connected to the second module-side terminal 26d of the RFIC module 14, at an end on the center side in the longitudinal direction (X-axis direction) of the main body part 512. The second antenna pattern 522 is folded back at the other end in the longitudinal direction of the main body part 512 and therefore includes a first portion 522b arranged on the module-mounting surface 512a of the main body part 512 and a second portion 522c arranged on the attachment surface 512b.

For this embodiment, a portion of the second portion 520c of the first antenna pattern 520 and a portion of the second portion 522c of the second antenna pattern 522 overlap each other on the attachment surface 512b of the main body part 512. Therefore, the portion of the second portion 520c of the first antenna pattern 520 and the portion of the second portion 522c of the second antenna pattern 522 overlapping each other are capacitively coupled across the antenna-supporting sheet 518.

According to the RFID tag 510 as described above, the second portions 520c, 522c in the two antenna patterns 520, 522 of the antenna element 516 can be connected in terms of a direct current, or can capacitively be coupled, to the metal surface of the article. Therefore, the RFID tag 510 can utilize the metal surface of the article as a radio-wave radiation surface. As a result, the RFID tag 510 can perform wireless communication at a longer communication distance (as compared to when not attached to the metal surface of the article).

A metal-compatible RFID tag having a structure different from the RFID tags 310, 410, 510 described above is also included in the embodiments of the present invention.

Figure 15:
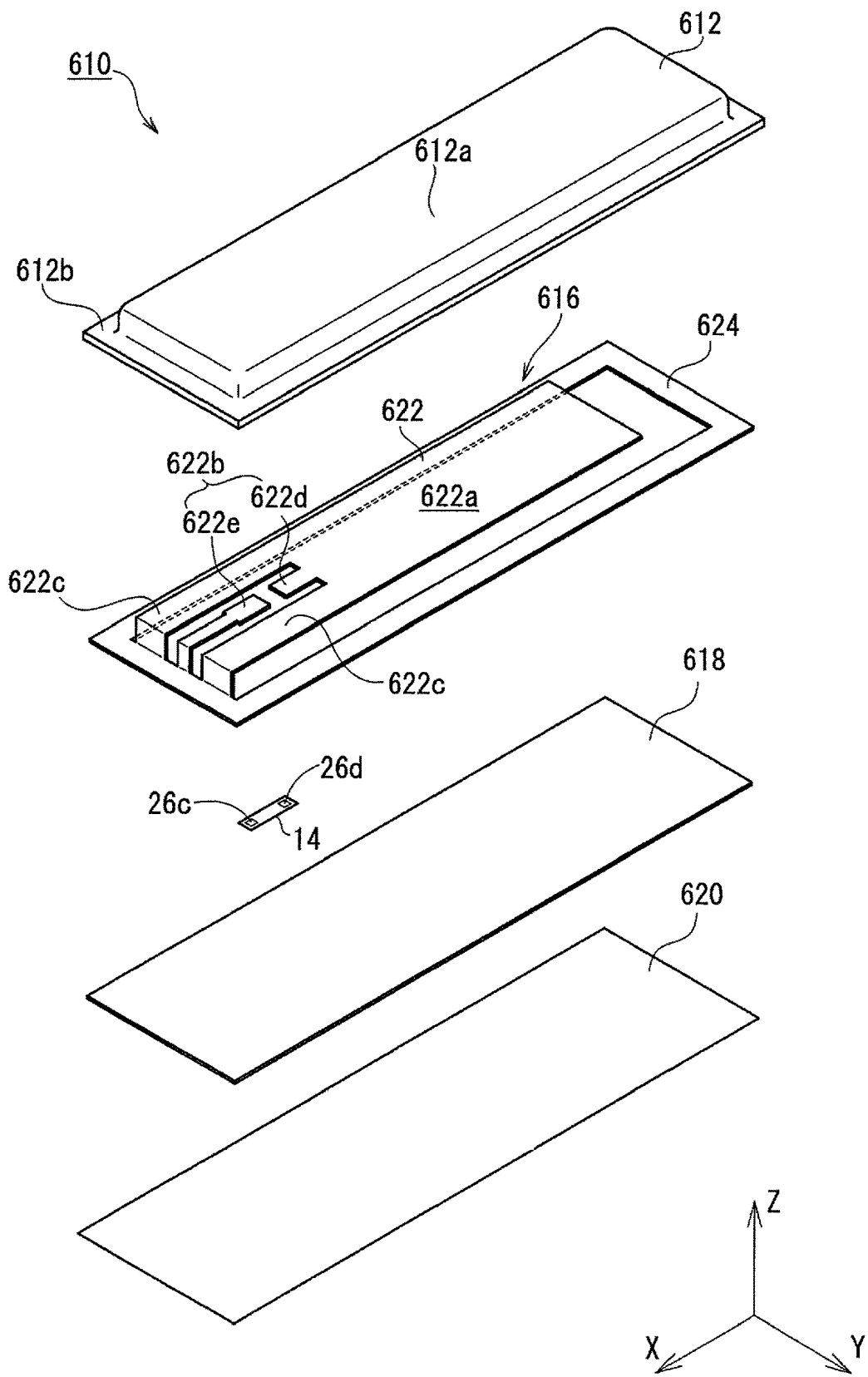
FIG. 15 is an exploded perspective view of a different exemplary metal-compatible RFID tag.
Figure 16:
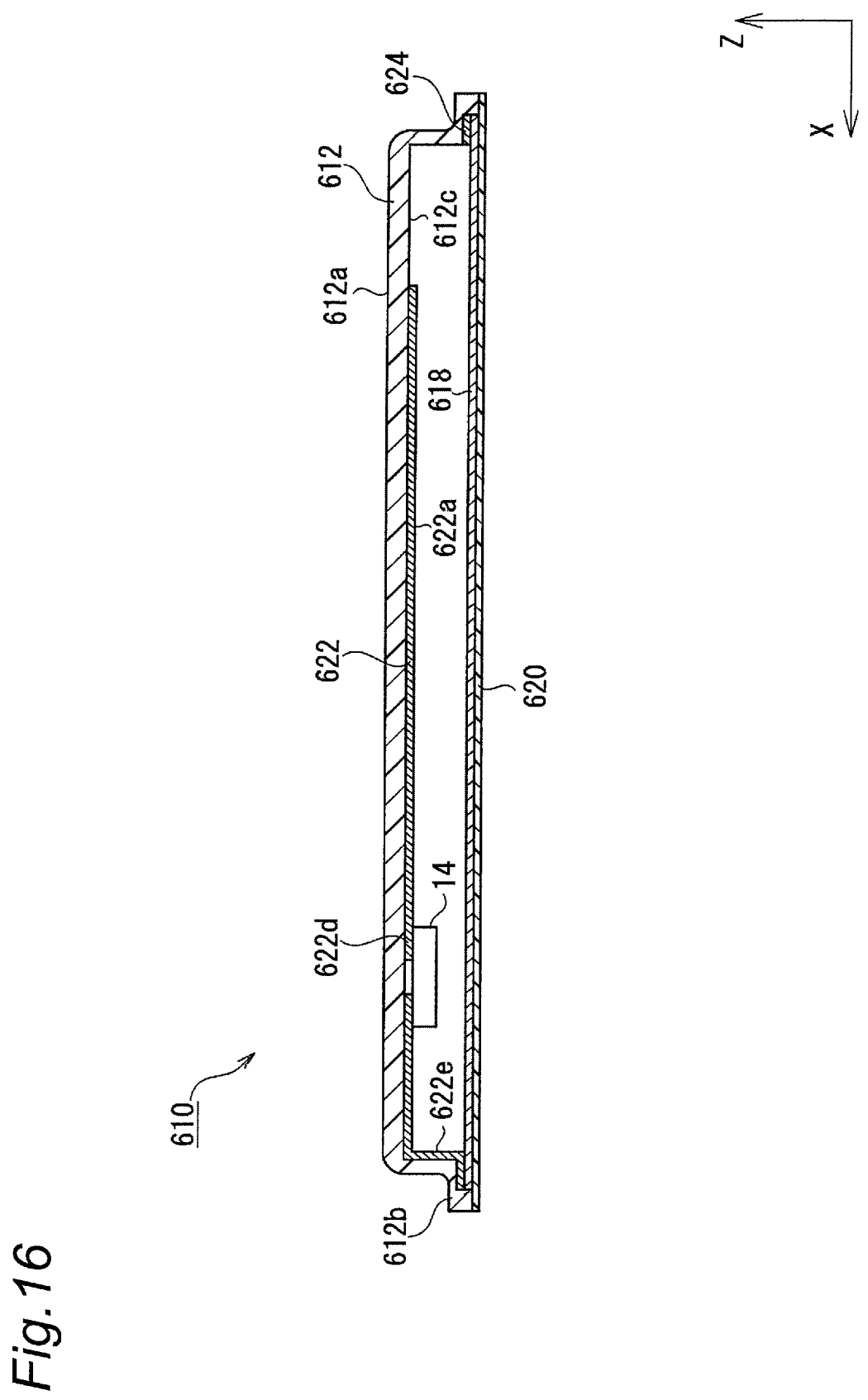
FIG. 16 is a cross-sectional view of the different exemplary metal-compatible RFID tag.
Figure 17:
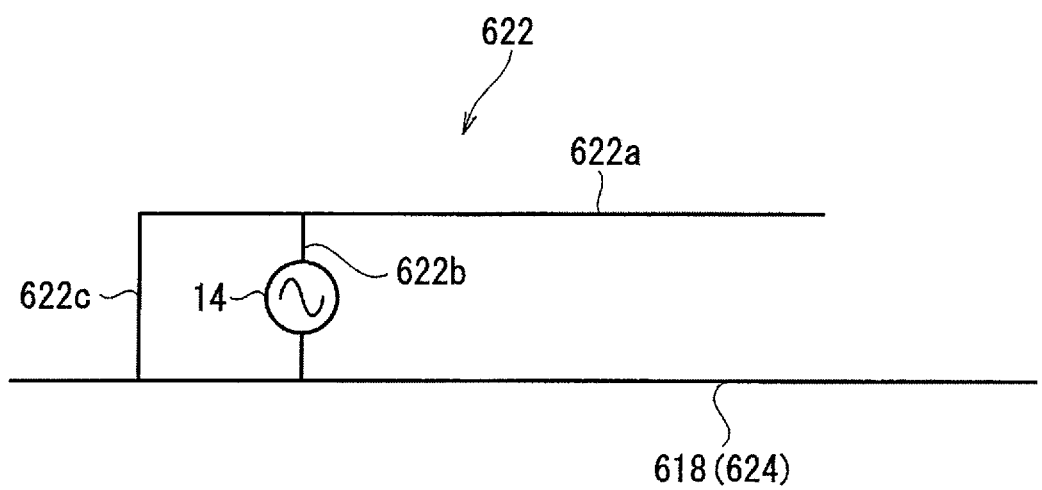
FIG. 17 is an equivalent circuit diagram of the different exemplary metal-compatible RFID tag.

FIG. 15 is an exploded perspective view of a different exemplary metal-compatible RFID tag. FIG. 16 is a cross-sectional view of the different exemplary metal-compatible RFID tag. FIG. 17 is an equivalent circuit diagram of the different exemplary metal-compatible RFID tag.

As shown in FIGS. 15 and 16, an RFID tag 610 is a metal-compatible RFID tag that can be attached to an article having a metal surface before use. Specifically, the RFID tag 610 includes the RFIC module 14, a cap-shaped main body part 612, the RFIC module 14, an antenna element 616, a metal plate 618, and a double-sided tape 620.

The cap-shaped main body part 612 is a member made of a resin material, for example, and includes a top plate part 612a and a flange part 612b.

The antenna element 616 is formed by cutting and raising a single metal sheet (or metal plate), for example. For example, the metal sheet is made from nickel/tin-plated brass that is easily cut and raised, for example. The antenna element 616 includes an antenna part 622 and an annular part 624.

As shown in FIG. 17, the antenna part 622 is an inverted-F antenna. Specifically, the antenna part 622 includes a main body part 622a attached to a back surface 612c of the top plate part 612a of the cap-shaped main body part 612, a feeder line part 622b connecting the main body part 622a and the annular part 624, and a short-circuit line part 622c connecting the main body part 622a and the annular part 624. As shown in FIG. 15, the feeder line part 622b includes the RFIC module 14 and includes a connecting part 622d connecting the second module-side terminal 26d of the RFIC module 14 and the main body part 622a, and a connecting part 622e connecting the first module-side terminal 26c of the RFIC module 14 and the annular part 624.

The annular part 624 of the antenna part 622 is disposed on the flange part 612b of the cap-shaped main body part 612 and is connected to the metal plate 618.

The metal plate 618 connected to the annular part 624 is preferably made of the same material as the antenna element 616, for example, nickel/tin-plated brass. A tin component reduces the contact resistance. The double-sided tape 620 for affixing the RFID tag 610 to a metal surface of an article is affixed to the metal plate 618.

According to the RFID tag 610 as described above, the metal plate 618 connected to the antenna element 616 can be connected in terms of a direct current (in the case of the double-sided tape 620 having conductivity) or can capacitively be coupled (in the case of the double-sided tape 620 having insulation properties) to a metal surface of an article. Therefore, the RFID tag 610 can utilize the metal surface of the article as a radio-wave radiation surface. As a result, the RFID tag 610 can perform wireless communication at a longer communication distance (as compared to when not attached to the metal surface of the article).

As described above, the RFID tag according to the exemplary embodiment of the present invention may have any form of the antenna element.

Specifically, in a broad sense, the RFID tag of the exemplary embodiment according to the present disclosure includes an RFIC module with a base substrate that includes a principal surface and an RFIC chip that includes a first input/output terminal and a second input/output terminal and that is mounted on the principal surface of the base substrate, and an antenna element including a first antenna-side terminal and a second antenna-side terminal. Moreover, the RFIC module includes, on the principal surface of the base substrate, a first chip connection terminal connected to the first input/output terminal of the RFIC chip, a second chip connection terminal connected to the second input/output terminal of the RFIC chip, a first module-side terminal connected in terms of a direct current, or capacitively coupled, to the first antenna-side terminal of the antenna element, a second module-side terminal connected in terms of a direct current, or capacitively coupled, to the second antenna-side terminal of the antenna element, a first wiring pattern connecting the first chip connection terminal and the first module-side terminal, a second wiring pattern connecting the second chip connection terminal and the second module-side terminal, and a third wiring pattern connecting the first module-side terminal and the second module-side terminal.

Although the exemplary embodiments of the present invention have been described with respect to a plurality of embodiments, it should be apparent for those skilled in the art that at least one embodiment can entirely or partially be combined with a certain embodiment to form a further embodiment according to the present invention.

EXPLANATIONS OF LETTERS OR NUMERALS

10 RFID tag
14 RFIC module
16 antenna element
18a first antenna-side terminal
20a second antenna-side terminal
22 base substrate
22a principal surface
24 RFIC chip
24a first input/output terminal
24b second input/output terminal
26a first chip connection terminal
26b second chip connection terminal
26c first module-side terminal
26d second module-side terminal
26e First wiring pattern
26f second wiring pattern
26g third wiring pattern

The invention claimed is:

1. An RFID tag comprising:
an RFIC module including a base substrate that includes a principal surface and an RFIC chip mounted thereon that includes first and second input/output terminals; and
an antenna element including first and second antenna-side terminals, wherein the RFIC module includes, on the principal surface of the base substrate:
a first chip connection terminal connected to the first input/output terminal of the RFIC chip,
a second chip connection terminal connected to the second input/output terminal of the RFIC chip,
a first module-side terminal connected to the first antenna-side terminal of the antenna element by either direct current or capacitive coupling,
a second module-side terminal connected to the second antenna-side terminal of the antenna element by either direct current or capacitive coupling,
a first wiring pattern connecting the first chip connection terminal to the first module-side terminal,
a second wiring pattern connecting the second chip connection terminal to the second module-side terminal, and
a third wiring pattern connecting the first module-side terminal to the second module-side terminal, and
wherein a distance between respective sides of the first antenna-side terminal and the second antenna-side terminal that face each other is larger than a distance between respective sides of the first module-side terminal and the second module-side terminal that face each other.

2. The RFID tag according to claim 1, wherein the first and second module-side terminals are arranged side by side at an interval in a longitudinal direction of the base substrate.

3. The RFID tag according to claim 1, wherein the first wiring pattern, the second wiring pattern, and the third wiring pattern each have a meandering shape.

4. The RFID tag according to claim 3, wherein the first wiring pattern and a first side of the third wiring pattern extend in a meandering configuration toward the first module-side terminal with the first side of the third wiring pattern maintaining a constant distance with the first wiring pattern, and the second wiring pattern and a second side of the third wiring pattern extend in a direction opposite from a direction that the first side of the third wiring pattern extends, wherein the second side of the third wiring pattern extends in a meandering configuration toward the second module-side terminal with the second side of the third wiring pattern maintaining a constant distance with the second wiring pattern.

5. The RFID tag according to claim 1, wherein each of the first chip connection terminal, the second chip connection terminal, the first module-side terminal, the second module-side terminal, the first wiring pattern, the second wiring pattern, and the third wiring pattern are integrated as a single conductor pattern.

6. The RFID tag according to claim 1, wherein the RFIC module further comprises a protective layer disposed on the principal surface of the base substrate to cover the RFIC chip, the first wiring pattern, the second wiring pattern, and the third wiring pattern.

7. The RFID tag according to claim 6, wherein the protective layer is disposed on the principal surface of the base substrate to at least partially cover the first module-side terminal and the second module-side terminal.

8. The RFID tag according to claim 6, wherein the protective layer contains a magnetic filler.

9. The RFID tag according to claim 1, wherein the base substrate comprises a flexible material.

10. The RFID tag according to claim 1, wherein the first, second and third wiring patterns each have respective inductances that form an impedance matching circuit between the antenna element and the RFIC chip.

11. The RFID tag according to claim 10, wherein the first, second and third wiring patterns each comprise respective lengths and thicknesses configured for matching at a communication frequency of the UHF band of the RFID tag.

12. The RFID tag according to claim 1, wherein the first and second module-side terminals are disposed on opposing ends of the principal surface of the base substrate in a longitudinal direction thereof.

13. The RFID tag according to claim 12, wherein the first and second wiring patterns extend in opposite directions from each other in the longitudinal direction and the third wiring pattern extends in the longitudinal direction and parallel to the first and second wiring patterns, such that a loop opening is formed from each of the first and second module-side terminals, and the first, second and third wiring patterns.

14. An RFID tag comprising:
an RFIC module including a base substrate that includes a principal surface and an RFIC chip mounted thereon that includes first and second input/output terminals; and
an antenna element including first and second antenna-side terminals, wherein the RFIC module includes, on the principal surface of the base substrate:
a first chip connection terminal connected to the first input/output terminal of the RFIC chip,
a second chip connection terminal connected to the second input/output terminal of the RFIC chip,
a first module-side terminal connected to the first antenna-side terminal of the antenna element by either direct current or capacitive coupling,
a second module-side terminal connected to the second antenna-side terminal of the antenna element by either direct current or capacitive coupling,
a first wiring pattern connecting the first chip connection terminal to the first module-side terminal, a second wiring pattern connecting the second chip connection terminal to the second module-side terminal, and a third wiring pattern connecting the first module-side terminal to the second module-side terminal, and wherein the RFIC chip, the first wiring pattern, the second wiring pattern, and the third wiring pattern are disposed in a region on the principal surface of the base substrate and are interposed entirely between respective sides of the first module-side terminal and the second module-side terminal that face each other.

15. An RFIC module comprising:

a base substrate;

an RFIC chip mounted on the base substrate that includes first and second input/output terminals;

a first chip connection terminal disposed on the base substrate and that is connected to the first input/output terminal of the RFIC chip;

a second chip connection terminal disposed on the base substrate and that is connected to the second input/output terminal of the RFIC chip;

first and second module-side terminals disposed on opposing ends of the base substrate in a longitudinal direction thereof;

a first wiring pattern disposed on the base substrate and connecting the first chip connection terminal to the first module-side terminal;

a second wiring pattern disposed on the base substrate and connecting the second chip connection terminal to the second module-side terminal, and a third wiring pattern disposed on the base substrate and connecting the first module-side terminal directly to the second module-side terminal, wherein the RFIC chip, the first wiring pattern, the second wiring pattern, and the third wiring pattern are disposed in a region on a principal surface of the base substrate and are interposed entirely between respective sides of the first module-side terminal and the second module-side terminal of the RFIC module that face each other.

16. The RFIC module according to claim 15, wherein the first and second module-side terminals are arranged side by side at an interval in the longitudinal direction of the base substrate.

17. The RFIC module according to claim 15, wherein the first, second and third wiring patterns each have respective inductances that form an impedance matching circuit between the antenna element and the RFIC chip, and wherein the first, second and third wiring patterns each comprise respective lengths and thicknesses configured for matching at a communication frequency of the UHF band of the RFID tag.

18. The RFIC module according to claim 15, wherein each of the first chip connection terminal, the second chip connection terminal, the first module-side terminal, the second module-side terminal, the first wiring pattern, the second wiring pattern, and the third wiring pattern are integrated as a single conductor pattern.

19. The RFIC module according to claim 15, further comprising a protective layer disposed on a principal surface of the base substrate to cover the RFIC chip, the first wiring pattern, the second wiring pattern, and the third wiring pattern.

* * * * *